(12) United States Patent  King

(10) Patent No.: US 6,330,702 B1
(45) Date of Patent: Dec. 11, 2001

(54) HAMMING VALUE DETERMINATION AND COMPARISON

(75) Inventor: Douglas B.S. King, Warton (GB)

(73) Assignee: Bae Systems plc, Farnborough (GB)

( * ) Notice: Subject to any disclaimer, the term of this patent is extended or adjusted under 35 U.S.C. 154(b) by 0 days.

(21) Appl. No.: 09/370,892

(22) Filed: Aug. 10, 1999

Related U.S. Application Data

(63) Continuation of application No. PCT/GB98/03835, filed on Dec. 18, 1998.

(30) Foreign Application Priority Data

Dec. 19, 1997 (GB) .................................................. 9726752
Oct. 27, 1998 (GB) .................................................. 9823398

(51) Int. Cl.⁷ ..................................................... G06F 7/02
(52) U.S. Cl. ...................................... 714/819; 340/146.2
(58) Field of Search ........................ 340/146.2; 714/819

(56) References Cited

U.S. PATENT DOCUMENTS

| | | | | |
|---|---|---|---|---|
| 3,350,685 | * | 10/1967 | Lindaman | 340/146.2 |
| 3,656,109 | * | 4/1972 | Conway | 340/146.2 |
| 4,119,946 | * | 10/1978 | Taylor | 340/146.3 Q |
| 5,029,305 | | 7/1991 | Richardson | 341/159 |
| 5,218,562 | * | 6/1993 | Basehore et al. | 364/728.03 |
| 5,382,955 | | 1/1995 | Knierim | 341/64 |
| 5,459,466 | | 10/1995 | Knierim et al. | 341/160 |

FOREIGN PATENT DOCUMENTS

| | | |
|---|---|---|
| 0 217 009 | 4/1987 | (EP) . |
| 0 221 238 | 5/1987 | (EP) . |
| 0 319 421 | 6/1989 | (EP) . |
| 0 591 846 | 4/1994 | (EP) . |
| 1 588 535 | 4/1981 | (GB) . |
| 2 223 369 | 4/1990 | (GB) . |
| 7-95091 | 4/1995 | (JP) . |

OTHER PUBLICATIONS

Van de Panne et al, "Macham: A Best Match Content Addressable Memory", Proceedings of the Pacific Rim Conference on Communications, Computers and Signal Processing, Victoria, Jun. 1–2, 1989, Jun. 1, 1989, pp. 612–615, Institute of Electrical and Electronics Engineers.

* cited by examiner

Primary Examiner—Stephen M. Baker
(74) Attorney, Agent, or Firm—Nixon & Vanderhye P.C.

(57) ABSTRACT

The comparators described herein comprise bit manipulation cells of a number of logic cells each built up of AND, OR etc. logic gates interconnected in parallel to make up one or more layers and do not rely on clocks, instead operating asynchronously. This makes the comparators highly robust and fault tolerant, and well suited for use as binary neurons in high integrity systems. They are less susceptible to radio frequency interference induced data corruption than alternative register-based implementations. Planar Hamming comparators capable of comparing two dimensional input arrays are also described.

33 Claims, 21 Drawing Sheets

A = 11001011
B = 00111100

A > B

N = 2 BIT SHIFT AND HAMMING ELIMINATOR
SYMBOL HCOMP2.1

N = 2 BIT    SHIFT AND HAMMING ELIMINATOR

2 Input Arrays

Outer array = 14
Inner array = 18

1st layer output

Outer array = 3 (11 bits eliminated)
Inner array = 7 (11 bits eliminated)

Outer array = 2
Inner array = 6

Outer array = 0
Inner array = 4

Inner array = 4

Final Stable State
Inner > Outer

*Fig. 18*

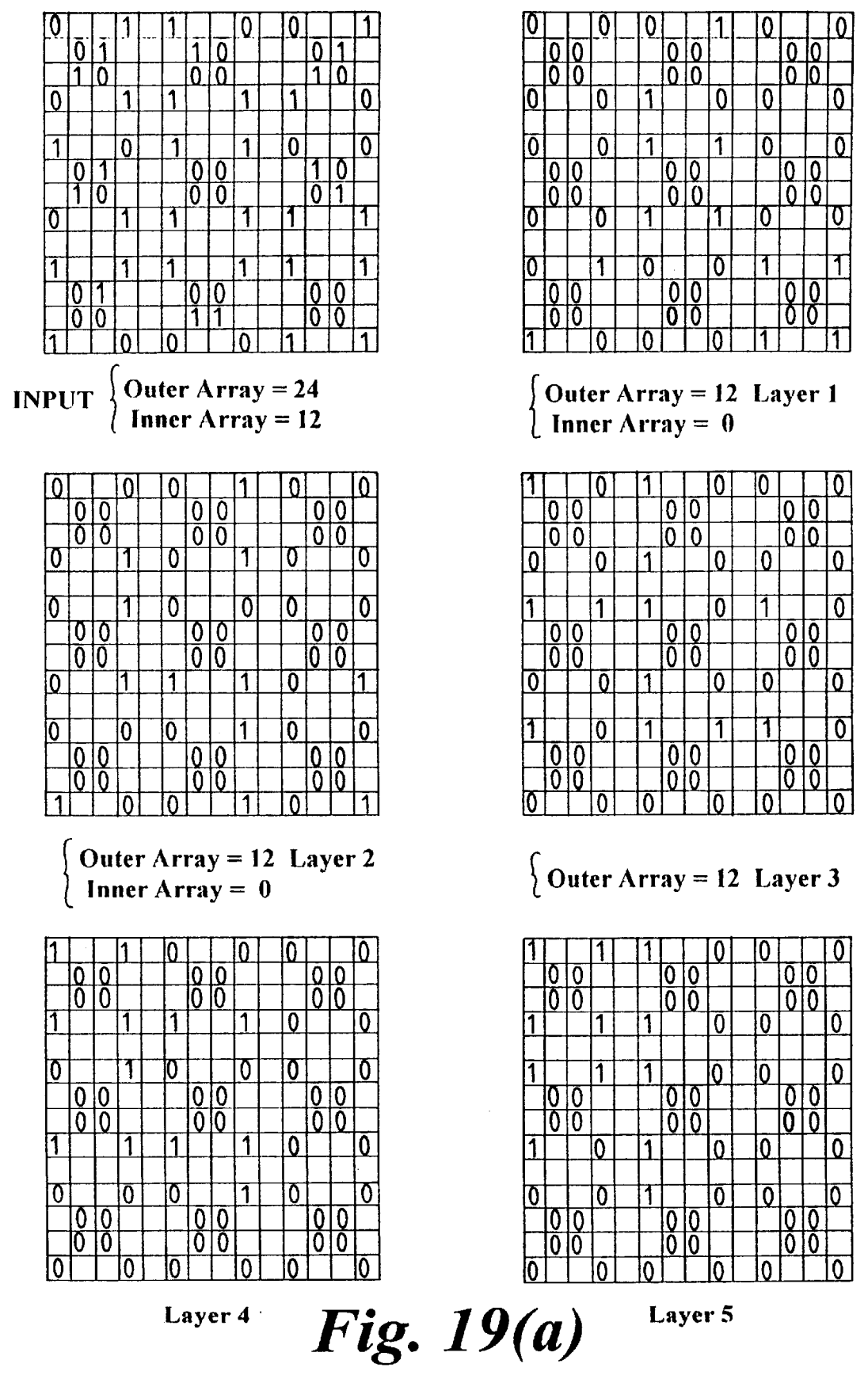

INPUT { Outer Array = 24
Inner Array = 12

{ Outer Array = 12  Layer 1
Inner Array = 0

{ Outer Array = 12  Layer 2
Inner Array = 0

{ Outer Array = 12  Layer 3

Layer 4

*Fig. 19(a)*

Layer 5

Final part of example 2

| 1 | | 1 | 1 | | 0 | | 0 | | 0 |
|---|---|---|---|---|---|---|---|---|---|
| | 0 0 | | | | 0 0 | | | 0 0 | |
| | 0 0 | | | | 0 0 | | | 0 0 | |
| 1 | | 1 | 1 | | 0 | | 0 | | 0 |
| 1 | | 1 | 1 | | 0 | | 0 | | 0 |
| | 0 0 | | | | 0 0 | | | 0 0 | |
| | 0 0 | | | | 0 0 | | | 0 0 | |
| 1 | | 1 | 1 | | 0 | | 0 | | 0 |
| 0 | | 0 | 0 | | 0 | | 0 | | 0 |
| | 0 0 | | | | 0 0 | | | 0 0 | |
| | 0 0 | | | | 0 0 | | | 0 0 | |
| 0 | | 0 | 0 | | 0 | | 0 | | 0 |

Layer 6

Outer > Inner
Set     Set

HAMMING VALUE DETERMINATION AND COMPARISON

This is a continuation of PCT application No. PCT/GB98/03835, filed Dec. 18, 1998, the entire content of which is hereby incorporated by reference in this application.

BACKGROUND OF THE INVENTION

1. Field of the Invention

This invention relates to methods and apparatus for determining the Hamming values of binary vectors or arrays in general and in particular, but not exclusively, to methods and apparatus for use in determining the Hamming value relationship of a set of weightless bits otherwise referred to herein as a weightless tuple or weightless vector. The invention also relates to apparatus and methods for determining the Hamming value relationship of two thermometer codes or weightless vectors. The invention further extends to a Hamming value comparator for comparing the Hamming value relationship of two 2-dimensional arrays of data. The invention still further extends to sum and threshold devices using Hamming value comparators of this invention.

2. Discussion of the Prior Art

The apparatus and methods described herein may usefully incorporate, utilise, be used with or be incorporated into any of the apparatus or methods described in our co-pending U.K. Patent Application Nos. 9726752.0, 9823361.2, 9823385.1, 9823322.8, and U.S. patent application Ser. Nos. 09/366,568, 09/371,270, and 09/368,585 which is now U.S. Pat. No. 6,262,676, the entire contents of which are incorporated herein by reference.

Terminology

The term "Hamming value" is used to define the number of logic 1's set in 1-dimensional arrays such as a binary number, tuple, vector, or 2 or higher dimensional arrays. The Hamming value relationship of two binary numbers or arrays indicates which has the greater Hamming value or whether the Hamming values are the same.

The term "weighted binary" is used in the conventional sense to indicate that successive bit positions are weighted, particularly . . . 16, 8, 4, 2, 1, although other weighted representations are possible. "Weightless binary" is a set of binary digits 1 and 0, each representing just "1" and "0" respectively. There is no least significant bit (LSB) or most significant bit (MSB). The set of bits may be ordered or without order. If all the 1's are grouped together e.g. [111000] then the code is referred to as a thermometer code, thermocode or bar graph code, all collectively referred to herein as "thermometer codes".

The term thermometer code is also used herein to describe arrays where the set bits are aggregated around a preset bit within the tuple, rather than aggregating towards one of the ends of the tuple. Likewise the term is also used to describe 2, 3 or higher dimensional arrays in which the set bits are clustered or aggregated around a preset focal bit position which may be anywhere within the array, e.g. at one corner or in the centre in a 2 or 3 dimensional array.

A set of weightless bits is referred to herein as a "weightless tuple" or "weightless vector" and these terms are not intended to be restricted to ordered sets.

In traditional neural networks, a real-valued synaptic value is multiplied by a synaptic connection strength or weight value, and summed with other similarly treated synapses before they are all summed and thresholded to form a neural output. The weight value is a real-valued synaptic connection strength and hence the common usage of the term "weighted neural network". However, it is also possible to have binary RAM-based neural networks that do not employ real-valued connection weights but instead rely on the values of the binary bits being either 0 or 1. Accordingly, there are two contexts of weightlessness: without synaptic connection strength, and without binary code weighting. The arrangements described herein employ weightless binary manipulation mechanisms and may be used to engineer weightless artificial neural networks, otherwise referred to as weightless-weightless artificial neural networks.

In one context, this invention is concerned with the comparison of two weightless vectors in terms of their Hamming values. This process is broadly equivalent to the function of a binary neuron. If the neuron receives a vector, A, of weightless synaptic values (e.g. [10110010]), and a vector, T, of weightless neural threshold values (e.g. [00101000]), the neuron may be required to fire, when the Hamming value of A is greater than the Hamming value of T. In this example, the threshold, T, can be thought of as a set of inhibitory synaptic values which must be exceeded if the neuron is to be fired. This is one particular example of an instance where it is required to determine the Hamming value relationship between two binary vectors, but there are very many other types of systems requiring this or similar processing. For example, this comparison and the other techniques disclosed herein may be used in flight control systems, voting systems with redundancy, safety critical systems, telecommunications systems, decision making systems, and artificial intelligence systems, such as neural networks.

In a prior art arrangement, a state machine based system is used to count the number of 1's set and digital arithmetic units are used for the binary comparison. For each weightless vector, each bit is scanned sequentially and a counter or arithmetic register incremented accordingly to evaluate the Hamming value. Thereafter, the contents of the respective counters or arithmetic registers are compared to determine the Hamming value relationship. This prior art technique is suited to implementation in software, using a microprocessor or similar state machine.

However, this technique is slow and prone to both conductive and emissive radio frequency interference (RFI) as it relies principally on clocks, counters and microprocessors. Both the speed of operation and susceptibility to disruption or corruption by other noise makes such a system ill-suited for safety critical systems such as flight control systems. By way of illustration, a flight control system may need to make rapid decisions based on the instantaneous "HIGH" or "LOW" state of several transducers reporting various aspects of the aircraft operation; corruption of one of the inputs to the decision making process (caused e.g. by noise or RFI disruption) could result in misinterpretation of one of the inputs with the result that the decision making processor or neural network make the wrong decision with potentially catastrophic consequences.

British Patent No. 1,588,535 discloses an arrangement in which file words are searched one at a time and the Hamming distance between a file word and a search word measured. It is noted that the Hamming distance (i.e. the number of bits in which the two words differ), is quite different from the Hamming value comparison, which typically determines which of two binary vectors or tuples has the greatest number of logic 1's set.

SUMMARY OF THE INVENTION

Accordingly, disclosed herein are various mechanisms for determining the Hamming value relationships of two binary vectors which use asynchronous Boolean logical bit cell manipulation schemes which are very fast for small weightless systems. In addition these tend to be more RFI resilient and more fault-tolerant than the weighted binary alternatives.

In the first described arrangement, two weightless binary vectors are first converted separately into thermometer code and thereafter the thermometer codes are compared by a thermocode comparator to determine the Hamming value relationship.

In the two subsequent related schemes, two weightless vectors are compared in parallel, without requiring separate conversion into thermometer code and subsequent comparison. However, the thermometer code converter and the thermocode comparator may each be used in different applications and the invention extends to these per se.

According to one aspect of this invention there is provided a Hamming value comparator for determining the Hamming value relationship (as herein defined) of two one or more dimensional arrays of bits, which comprises means for applying said arrays to one or more bit manipulation cells or logic elements for performing at least one of a shift operation and a bit elimination operation to determine the Hamming value relationship of said arrays.

This invention also provides a Hamming value comparator for determining the Hamming value relationship (as herein defined) of two binary arrays, which comprises processing means comprising a plurality of layers of bit manipulation cells each having a plurality of inputs and a plurality of outputs, input means for passing corresponding bits from each of the two binary arrays to respective inputs of bit manipulation cells in the first layer of said processing means, the bit manipulation cells being interconnected by passing the outputs of each layer apart from the last to respective inputs of the next or next-but-one layer, thereby to provide an output indicative of said Hamming value relationship.

The comparator is particularly intended for use with weightless arrays or words, but its use for weighted arrays or words is not excluded.

Each bit manipulation cell may include four inputs and four outputs, the bit manipulation cells in said first layer being arranged such that, for each bit manipulation cell, two inputs each receive a respective bit from one of said binary arrays, and the other two inputs each receive a respective bit from the other binary array.

Each of said two inputs in the bit manipulation cells in said first layer preferably receives adjacent bits of the corresponding binary array, taken on an even boundary. Each manipulation cell preferably performs an operation on the bits from said first and second binary arrays received at the respective inputs, whereby a set bit is shifted in a common direction and correspondingly positioned set bits are fully or partially eliminated. Thus, each of said bit manipulation cells may effect a shift and full elimination process, as set out in the truth table below (or the inverse thereof):

| A in L | A in R | B in L | B in R | A out L | A out R | B out L | B out R |
|---|---|---|---|---|---|---|---|
| 0 | 0 | 0 | 0 | 0 | 0 | 0 | 0 |
| 0 | 0 | 0 | 1 | 0 | 0 | 1 | 0 |
| 0 | 0 | 1 | 0 | 0 | 0 | 1 | 0 |
| 0 | 0 | 1 | 1 | 0 | 0 | 1 | 1 |
| 0 | 1 | 0 | 0 | 1 | 0 | 0 | 0 |
| 0 | 1 | 0 | 1 | 0 | 0 | 0 | 0 |
| 0 | 1 | 1 | 0 | 0 | 0 | 0 | 0 |
| 0 | 1 | 1 | 1 | 0 | 0 | 1 | 0 |
| 1 | 0 | 0 | 0 | 1 | 0 | 0 | 0 |
| 1 | 0 | 0 | 1 | 0 | 0 | 0 | 0 |
| 1 | 0 | 1 | 0 | 0 | 0 | 0 | 0 |
| 1 | 0 | 1 | 1 | 0 | 0 | 1 | 0 |
| 1 | 1 | 0 | 0 | 1 | 1 | 0 | 0 |
| 1 | 1 | 0 | 1 | 1 | 0 | 0 | 0 |
| 1 | 1 | 1 | 0 | 1 | 0 | 0 | 0 |
| 1 | 1 | 1 | 1 | 0 | 0 | 0 | 0 | wherein AinL, AinR, BinL, BinR, are the four inputs to the cell and AoutL, AoutR, BoutL, BoutR are the four outputs.

Alternatively, each of said bit manipulation cells may effect a shift and partial elimination process as set out in

| A in L | A in R | B in L | B in R | A out L | A out R | B out L | B out R |
|---|---|---|---|---|---|---|---|
| 0 | 0 | 0 | 0 | 0 | 0 | 0 | 0 |
| 0 | 0 | 0 | 1 | 0 | 0 | 1 | 0 |
| 0 | 0 | 1 | 0 | 0 | 0 | 1 | 0 |
| 0 | 0 | 1 | 1 | 0 | 0 | 1 | 1 |
| 0 | 1 | 0 | 0 | 1 | 0 | 0 | 0 |
| 0 | 1 | 0 | 1 | 0 | 0 | 0 | 0 |
| 0 | 1 | 1 | 0 | 1 | 0 | 1 | 0 |
| 0 | 1 | 1 | 1 | 0 | 0 | 1 | 0 |
| 1 | 0 | 0 | 0 | 1 | 0 | 0 | 0 |
| 1 | 0 | 0 | 1 | 1 | 0 | 1 | 0 |
| 1 | 0 | 1 | 0 | 0 | 0 | 0 | 0 |
| 1 | 0 | 1 | 1 | 0 | 0 | 1 | 0 |
| 1 | 1 | 0 | 0 | 1 | 1 | 0 | 0 |
| 1 | 1 | 0 | 1 | 1 | 0 | 0 | 0 |
| 1 | 1 | 1 | 0 | 1 | 0 | 0 | 0 |
| 1 | 1 | 1 | 1 | 0 | 0 | 0 | 0 |

Preferably, each bit manipulation cell has a first plurality of inputs for receiving respective bits from one of said binary words, a second plurality of inputs for receiving respective bits from the other of said binary words, a corresponding plurality of outputs, and logic means for outputting on a respective pre-selected one of said outputs a set bit if the Hamming value of the bits on said first plurality of inputs is greater than the Hamming value of the bits set on said second plurality of inputs.

In another aspect, this invention provides a Hamming value comparator for determining the Hamming value relationship (as herein defined) of two one or more dimensional binary arrays, which comprises a bit manipulation cell having a first plurality of inputs for receiving respective bits from one of said binary arrays and a second plurality of inputs for receiving respective bits from the other of said binary arrays, wherein said bit manipulation cell has a corresponding plurality of outputs, and logic means for outputting on a pre-selected one of said outputs a set bit if the Hamming value of the bits set on said first plurality of inputs is greater than the Hamming value of the bits set on said second plurality of inputs.

In another aspect, this invention provides a Hamming value comparator for comparing two one or more dimensional binary arrays and comprising a plurality of alternate layers of manipulation cells, one of said layers comprising a plurality of first bit manipulation cells for shifting set bits in the input arrays towards a pre-set position, others of said layers comprising a plurality of said first bit manipulation cells, in combination with a Hamming Elimination cell for eliminating corresponding set bits in each of said arrays.

In a further aspect this invention provides a planar Hamming value comparator, for comparing the Hamming values of two 2-dimensional arrays of binary data, said comparator comprising a plurality of layers of bit manipulation cells, each cell including at least two inputs and two outputs and being adapted to shift set bits towards a preset bit position, and being interconnected between layers to effect at least one of bit shifting and bit elimination, thereby to obtain an output indicative of the Hamming value relationship of said arrays.

In another aspect, this invention provides a Hamming value comparator for determining the Hamming value relationship (as herein defined) of two thermometer codes, which comparator comprises an array of logic elements corresponding to the bit positions of the two thermometer codes, each logic element receiving the bits from the two thermometer codes at a respective bit position and comparing said bits of the thermometer codes, the array providing an output indicative of the Hamming value relationship of said thermometer codes.

Thus, said array of logic elements may provide an output indicative of whether a given one of said thermometer codes has a bit set at a position in which a corresponding bit of the other thermometer code is not set. In this instance the comparator preferably includes a further array of logic elements for providing an output indicative of whether the other thermometer code has a bit set at a position in which the corresponding bit of said first thermometer code is not set.

The or each array of logic elements may comprise an array of gates each having two inputs to which the corresponding bits at a respective position in the thermometer codes are supplied. Each of said gates may comprise an AND gate with one input inverted, or the De Morgan equivalent thereof.

The invention also provides a method of determining the Hamming value relationship of two thermometer codes, which comprises supplying said codes to an array of logic elements for comparing the respective bits of said thermometer codes at each bit position and thereby determining the Hamming value relationship.

The invention also provides a method of determining the Hamming value relationship (as herein defined) of two thermometer codes, which comprises performing an elimination function at each bit position, wherein at each bit position, the corresponding bits of the thermometer codes are compared and unset if both bits are set, and the Hamming value relationship determined on the basis of which if either codes has a bit set after performance of said elimination function.

It will be appreciated that the inverse of this operation may also be achieved.

Whilst the invention has been described above, it extends to any inventive combination of the features set out above or in the following description.

BRIEF DESCRIPTION OF THE DRAWINGS

The invention may be performed in various ways, and, by way of example only, various embodiments thereof will now be described in detail, reference being made to the accompanying drawings which utilise the conventional symbols for logic gates and, in which:

FIGS. 18 and 19 are worked examples of the planar Hamming value comparator of FIG. 15.

DESCRIPTION OF PREFERRED EMBODIMENTS

Hamming Value Comparator for Thermometer Codes

Figure 1:
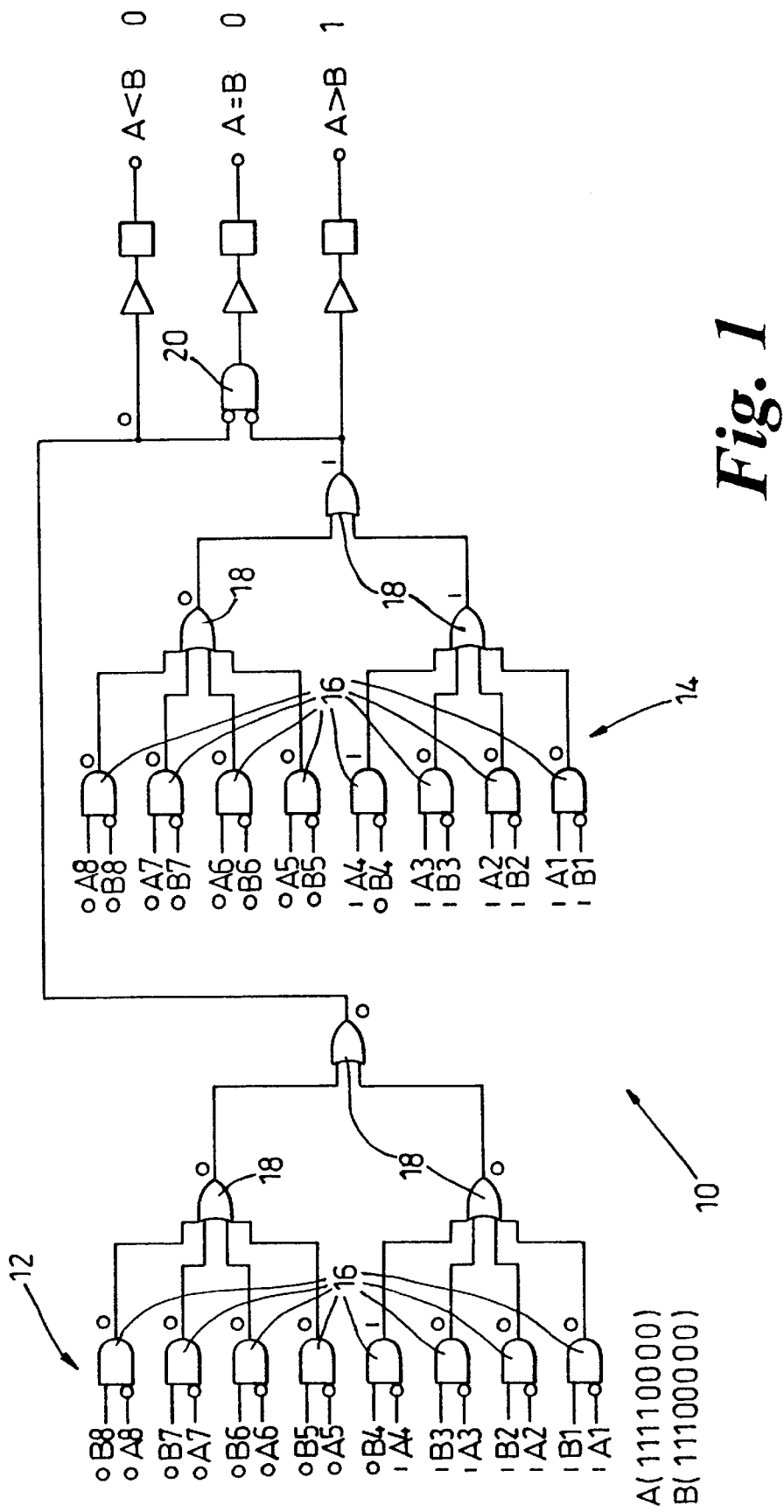
FIG. 1 is a circuit diagram of an embodiment of a Hamming value comparator in accordance with this invention for determining the Hamming value relationship of two thermometer codes.

Referring now to FIG. 1, the Hamming value comparator illustrated therein is required to have the property that when the Hamming value (i.e. the number of logic 1's set) of a first thermometer code A (A1, A2, . . . A8) is greater than the Hamming value of a second thermometer code B (B1, B2, . . . B8), then the A>B output shall be set high. Likewise when the Hamming value of thermometer code A is less than that of the thermometer code B then the A<B output shall be set high, and when the Hamming values of the codes are the same, then the A=B output shall be set high.

The comparator 10 comprises a first and a second similar array 12, 14 of AND gates 16. In the first array, the corresponding bits from each thermometer code (A1, A2, A3, A4, A5, A6, A7, A8) and (B1, B2, B3, B4, B5, B6, B7, B8) are supplied to a corresponding number of AND gates 16, with the A bit being supplied to an inverting terminal of the AND gate 16 and the B bit being supplied to a non-inverting terminal. The outputs of the AND gates are "ORed" together by three OR gates 18. Inspection of the first array 12 will show that the output from the final OR gate 18 will be high if, at any particular bit position in the vectors, the A bit is zero and the B bit is one. In the example given this does not apply. Given that the binary input vectors B and A are both in thermometer code, a "high" output from the final OR gate 18 of the array 12 indicates that the Hamming value of B is greater than the Hamming value of A.

The second array 14 is similar to that of the first array except that the B and A inputs are reversed. The outputs of the AND gates 16 are ORed together by OR gates 18 as previously. The output of the final OR gate 18 is high if the Hamming value of thermometer code A is greater than the Hamming value of the thermometer code B.

The outputs of the respective output OR gates from both arrays 12, 14 are also inverted and supplied to an AND gate 20. Accordingly, the output A>B goes high if the Hamming value of A is greater than that for B. the output A=B goes high if the Hamming values are equal, and the output A<B goes high if the Hamming value of A is less than that of B.

This arrangement provides an ultra-fast parallel implementation. This example shows the word length of 8 bits, but the architecture is extensible to deal with other word lengths as required. The architecture may also be integrated within a state machine or as an operation within a bit slice computer or microprocessor. The comparator may be employed as a threshold function in an artificial weightless neural network, and is also suited to voting/majority logic systems, and there are many possible applications within digital communication systems. The comparator as illustrated is considerably faster than state machine, conventional microprocessor, or weighted binary counter based alternatives.

Hamming Value Comparator for Weightless Tuples

The embodiments of FIG. 1 requires the inputs A and B to be in thermometer code. Often this will not be the case and in general this embodiment would require a two stage process to determine the Hamming value relationships of two N-tuple weightless vectors; the vectors would need to be first converted into thermometer code (e.g. using a thermometer code comparator as described in our co-pending U.K. Patent Application No. 9726752.0. Thereafter the Hamming values of the thermometer codes would be compared to provide the required output.

Referring now to the embodiments of FIGS. 2 to 7, here the Hamming value relationship of two N-tuple weightless vectors is determined using a single comparator. In both embodiments, a four input, four output modular bit manipulation cell is defined to operate on two elements of each of the N-tuples A and B, and the manipulation cells are built into an architecture that performs the required comparison in parallel.

Figure 2:
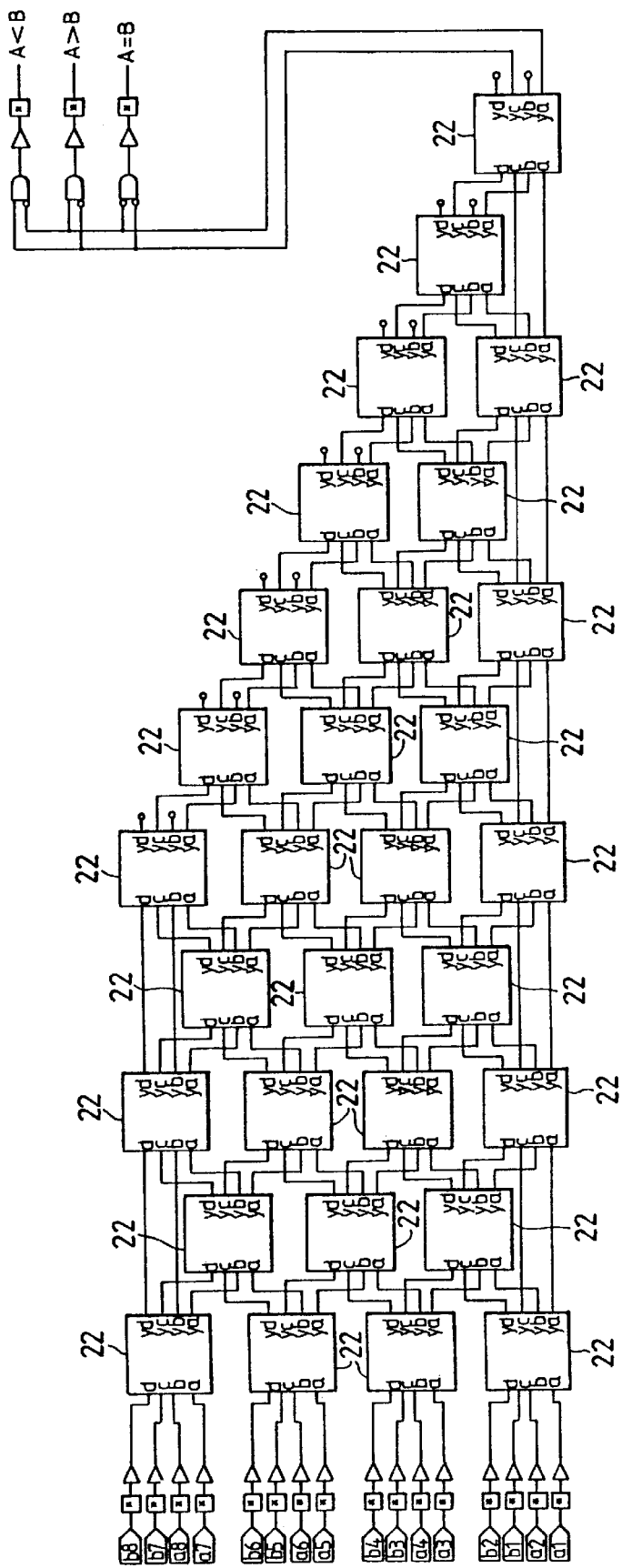
FIG. 2 is a circuit diagram of a first embodiment of weightless binary comparator in accordance with this invention for determining the Hamming value relationship of two weightless binary vectors.

Referring firstly to the embodiment of FIGS. 2 and 3, each of the bit manipulation cells 22 has 4 inputs and 4 outputs. In the input layer, and throughout the network, two inputs of each cell 22 are associated with digits of the A vector and two inputs are associated with digits of the B vector. In FIG. 2, as viewed, the lower two inputs of each cell 22 are associated with the A vector, and the upper two inputs are associated with the B vector.

As is apparent from FIG. 2, the number of bit manipulation cells 22 in each layer alternates between even and odd, although the seventh and succeeding stages are truncated because the relevant outputs are taken from a single manipulation cell 22 in the final stage, and so the bit manipulation cells removed by truncation are redundant as these cells would not contribute to this single manipulation cell. The connections between bit manipulation cells 22 in adjacent layers are staggered such that, apart from in the input layer, each bit manipulation cell 20 receives respective inputs from two bit manipulation cells in either one or two previous layers depending on whether the bit manipulation cell is at either end of the layer and whether the layer has an odd or even number of cells 52.

Referring to FIGS. 3($a$) and 3($b$), these show two alternative logic circuits providing the required manipulation. For ease of comparison, it should be noted that the cell inputs labelled (a, b, c, d) in FIG. 2 correspond to inputs labelled (AinL, AinR, BinL, BinR) in FIGS. 3($a$) and 3($b$), and outputs labelled (Ya, Yb, Yc, Yd) in FIG. 2 correspond to outputs labelled (AoutL, Aout R, BoutL, BoutR) in FIG. 3($a$). In FIG. 3($a$) the arrangement comprises inverters 24, AND gates 26 and OR gates 28.

The reduced Boolean equations for AoutL, AoutR, BoutL, and BoutR are stated below, where q, r, s and t represent AinL, AinR, BinL and BinR respectively. The Boolean operators "NOT", "AND or "OR" are represented by !, & and # respectively.

$$AoutL = q \ \& \ r \ \& \ !s$$

$$\# \ r \ \& \ !s \ \& \ !t$$

$$\# \ q \ \& \ !s \ \& \ !t$$

$$\# \ q \ \& \ r \ \& \ !t$$

$$AoutR = q \ \& \ r \ \& \ !s \ \& \ !t$$

$$BoutL = !q \ \& \ r \ \& \ s$$

$$\# \ !r \ \& \ s \ \& \ t$$

$$\# \ !q \ \& \ s \ \& \ t$$

$$\# \ !q \ \& \ !r \ \& \ t$$

$$BoutR = !q \ \& \ !r \ \& \ s \ \& \ t \quad \text{(Equation Set (1))}$$

Each of the bit manipulation cells 52 performs a combinatorial full shift and full Hamming elimination operation, as shown in the following truth table in which the four inputs to the cell are designated AinL, AinR, BinL, and BinR with the corresponding outputs being identified AoutL, AoutR, BoutL and BoutR reading both inputs and outputs in the same direction, left to right.

| A in L | A in R | B in L | B in R | A out L | A out R | B out L | B out R |
|---|---|---|---|---|---|---|---|
| 0 | 0 | 0 | 0 | 0 | 0 | 0 | 0 |
| 0 | 0 | 0 | 1 | 0 | 0 | 1 | 0 |

-continued

| A in L | A in R | B in L | B in R | A out L | A out R | B out L | B out R |
|--------|--------|--------|--------|---------|---------|---------|---------|
| 0 | 0 | 1 | 0 | 0 | 0 | 1 | 0 |
| 0 | 0 | 1 | 1 | 0 | 0 | 1 | 1 |
| 0 | 1 | 0 | 0 | 1 | 0 | 0 | 0 |
| 0 | 1 | 0 | 1 | 0 | 0 | 0 | 0 |
| 0 | 1 | 1 | 0 | 0 | 0 | 0 | 0 |
| 0 | 1 | 1 | 1 | 0 | 0 | 1 | 0 |
| 1 | 0 | 0 | 0 | 1 | 0 | 0 | 0 |
| 1 | 0 | 0 | 1 | 0 | 0 | 0 | 0 |
| 1 | 0 | 1 | 0 | 0 | 0 | 0 | 0 |
| 1 | 0 | 1 | 1 | 0 | 0 | 1 | 0 |
| 1 | 1 | 0 | 0 | 1 | 1 | 0 | 0 |
| 1 | 1 | 0 | 1 | 1 | 0 | 0 | 0 |
| 1 | 1 | 1 | 0 | 1 | 0 | 0 | 0 |
| 1 | 1 | 1 | 1 | 0 | 0 | 0 | 0 |

Inspection of the truth table will show that the bit manipulation cells shift a set bit from a right hand position (AinR or BinR) to the left if the bit of that position has not already been set, but it does not transfer bits across the boundary between AinR and BinL; for example (0001) is mapped to (0010), whereas (0010) is unaltered. Likewise (0100) is mapped to (1000). In addition, a cancellation operation is carried out whereby a set bit on one side of the A:B boundary cancels a set bit (in either position) on the other side of the boundary, thus unsetting both bits. This is illustrated for example by the following mappings; (0101) to (0000); (0110) to (0000); (1101) to (1000), and (1111) to (0000). It will also be noted from the truth table that the 16 possible input states have been reduced to 5 possible output states.

Figure 3A:
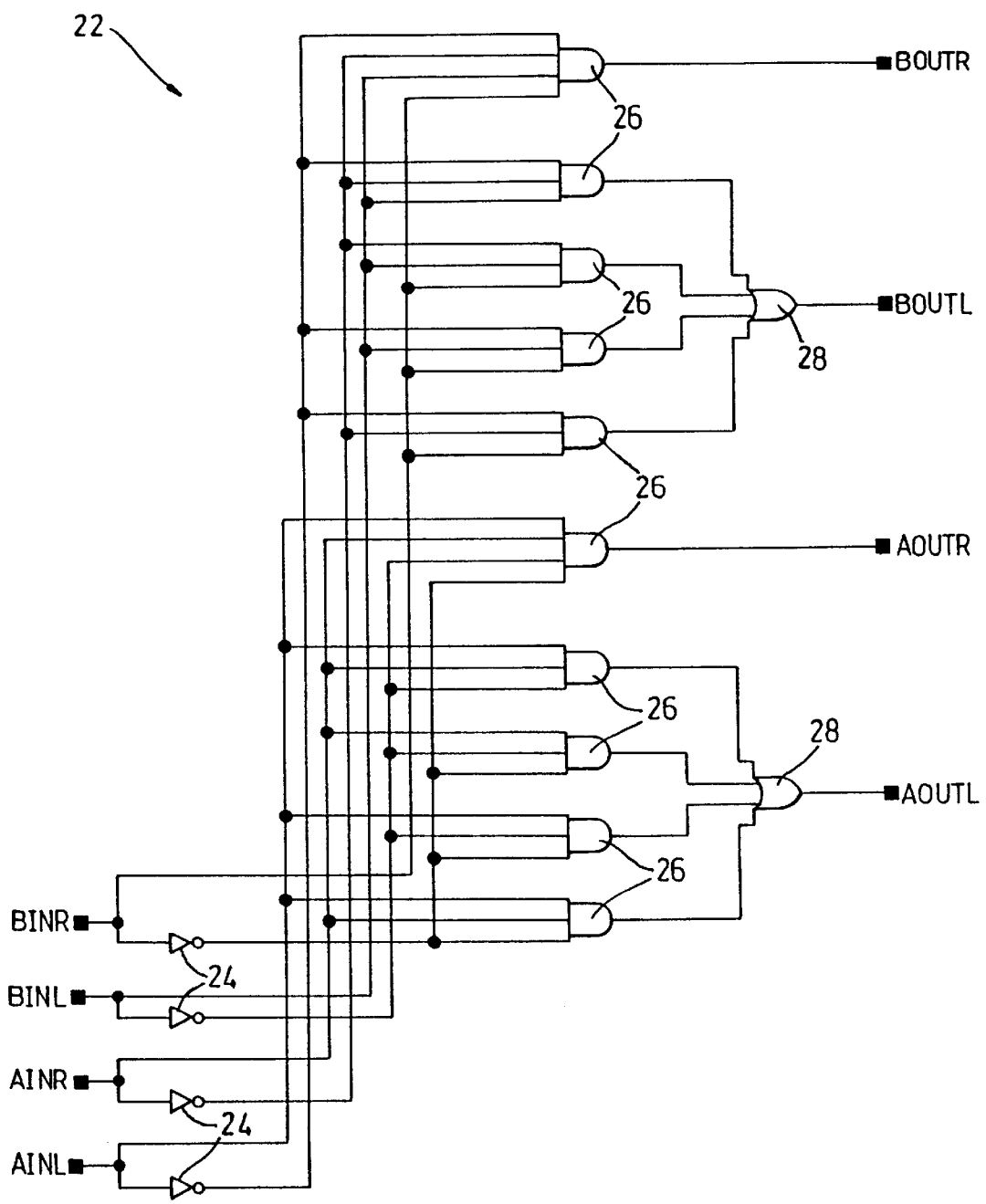
FIGS. 3(a) and 3(b) are circuit diagrams of two of the bit manipulation cells for use in the weightless binary comparator of FIG. 2, one for performing full shift and full Hamming elimination and the other for performing partial shift and Hamming elimination respectively.
Figure 3B:
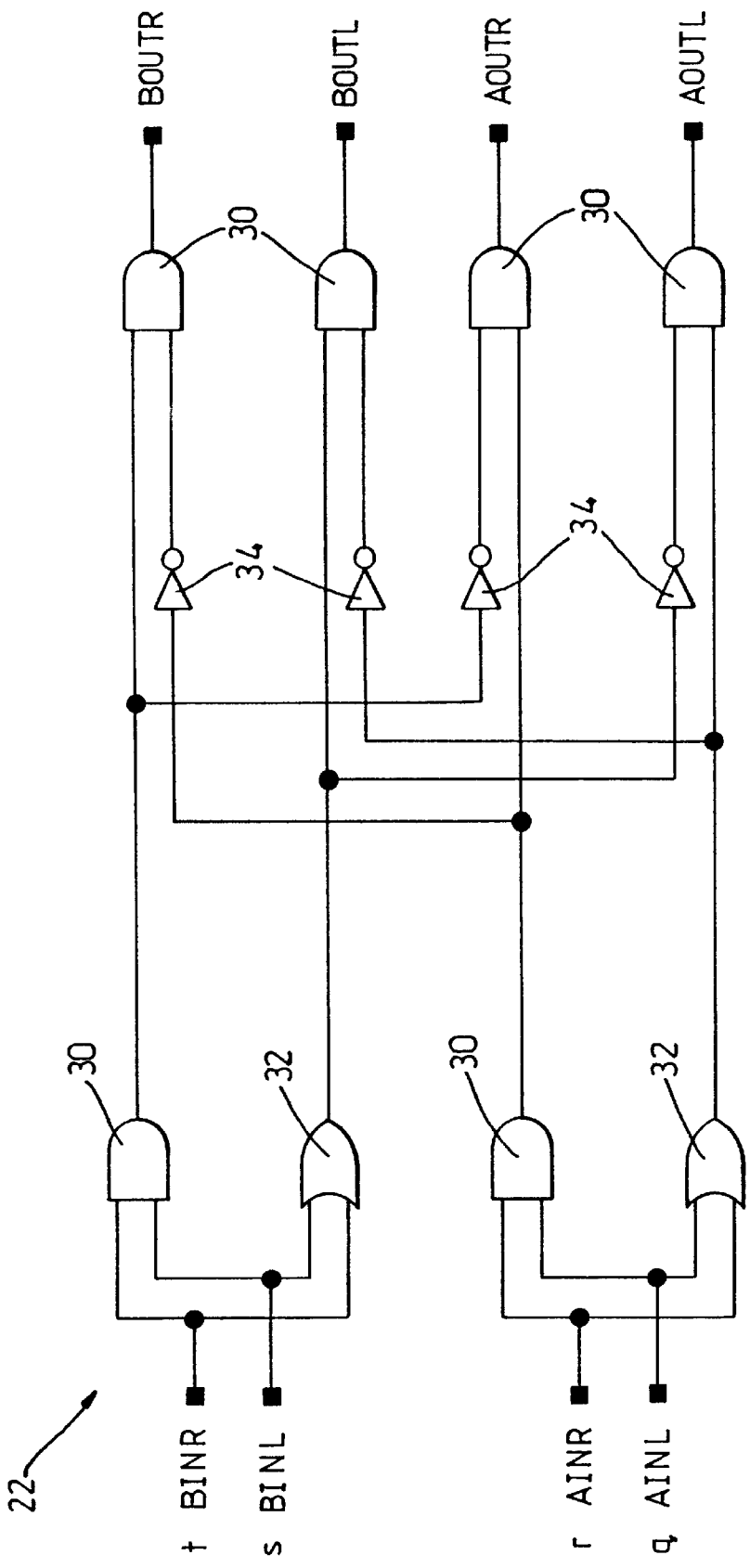

An alternative form of bit manipulation cell which performs a generally similar operation, but with some differences, is shown in FIG. 3(b). This is made up of AND gates 30, OR gates 32 and inverters 34 as shown and performs a combinatorial partial shift and full Hamming elimination. Thus an input (1110) to the FIG. 3(b) cell, which in the cell of FIG. 3(a) would give an output of (1000), gives instead the output (0100). However the cell of FIG. 3(b) may be built into an array and used to achieve Hamming value comparison.

The AoutL and BoutL bits of the final bit cell manipulator are used to determine the comparator outputs as defined by the truth table below. AoutL and BoutL cannot be high simultaneously.

| (Ya) Final AoutL | (Yb) Final BoutL | A > B | B > A | A = B |
|------------------|------------------|-------|-------|-------|
| 0 | 0 | FALSE | FALSE | TRUE |
| 1 | 0 | TRUE | FALSE | FALSE |
| 0 | 1 | FALSE | TRUE | FALSE |

Although the comparator is described by reference to use with weightless binary tuples, it will of course be appreciated that it will operate with thermometer code.

Figure 4:
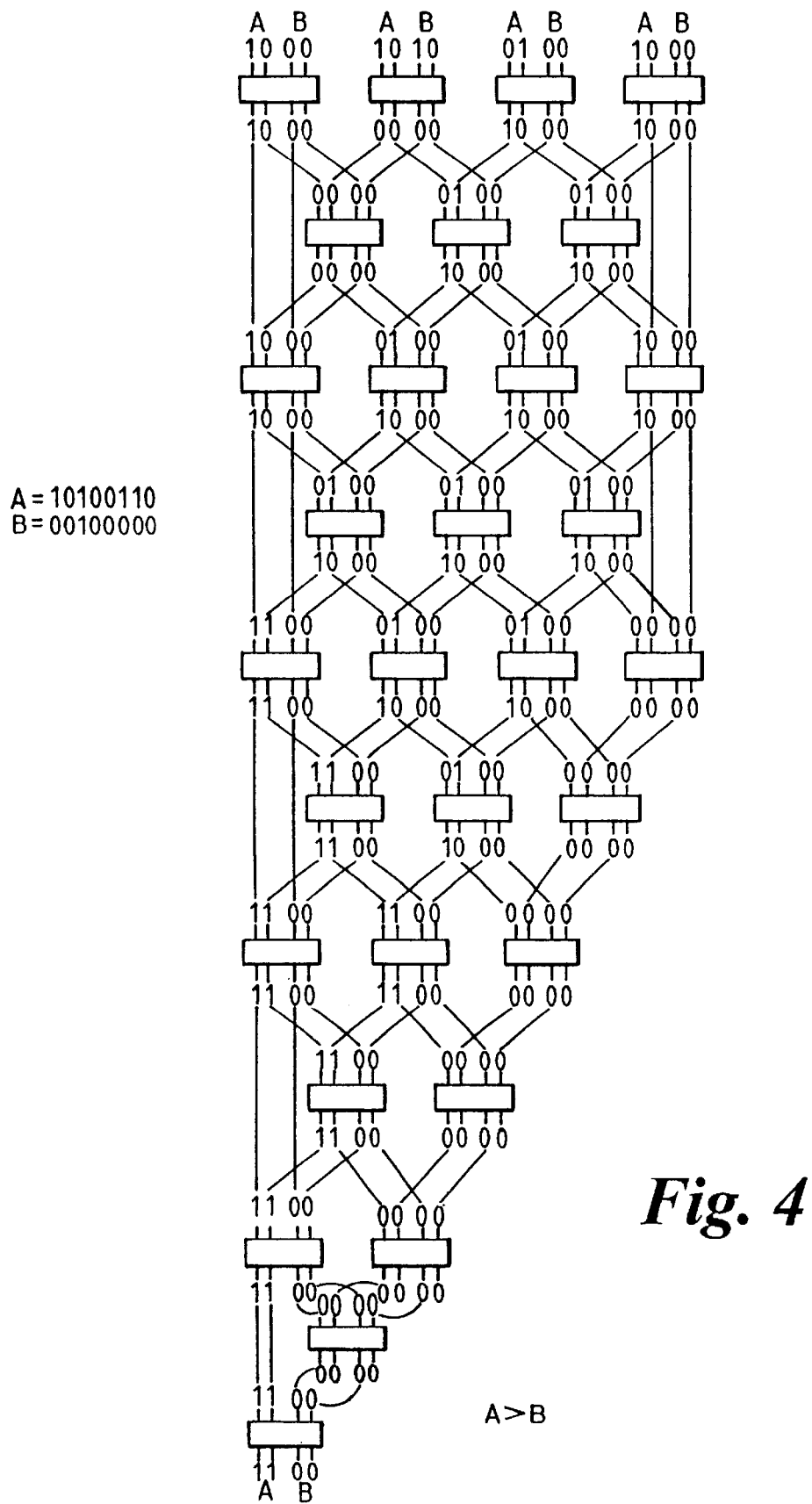
FIG. 4 is a worked example of the weightless binary comparator of FIG. 2 showing the bits set on the inputs and outputs of the bit manipulation cells in response to the input of typical weightless binary vectors.

FIG. 4 is a worked example showing comparison of the tuple A (10100110) with a Hamming value of 4, with B (00100000) having a Hamming value of 1. At the final output stage 45, which shows values (1100) it will be seen that AoutL is high and BoutL is low indicating that the Hamming value of A is greater than that of B, as defined in the truth table above.

Figure 5:
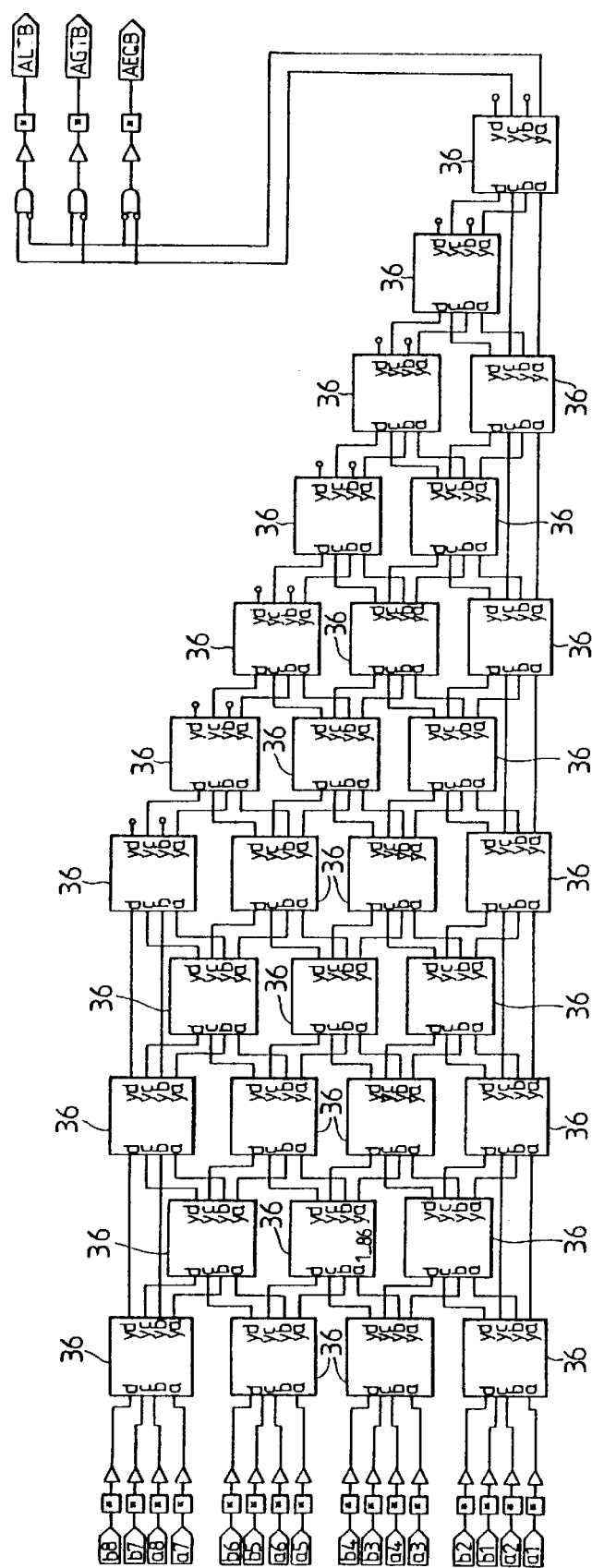
FIG. 5 is a circuit diagram of a second embodiment of weightless binary comparator in accordance with this invention for determining the Hamming value relationship of two binary vectors.
Figure 6:
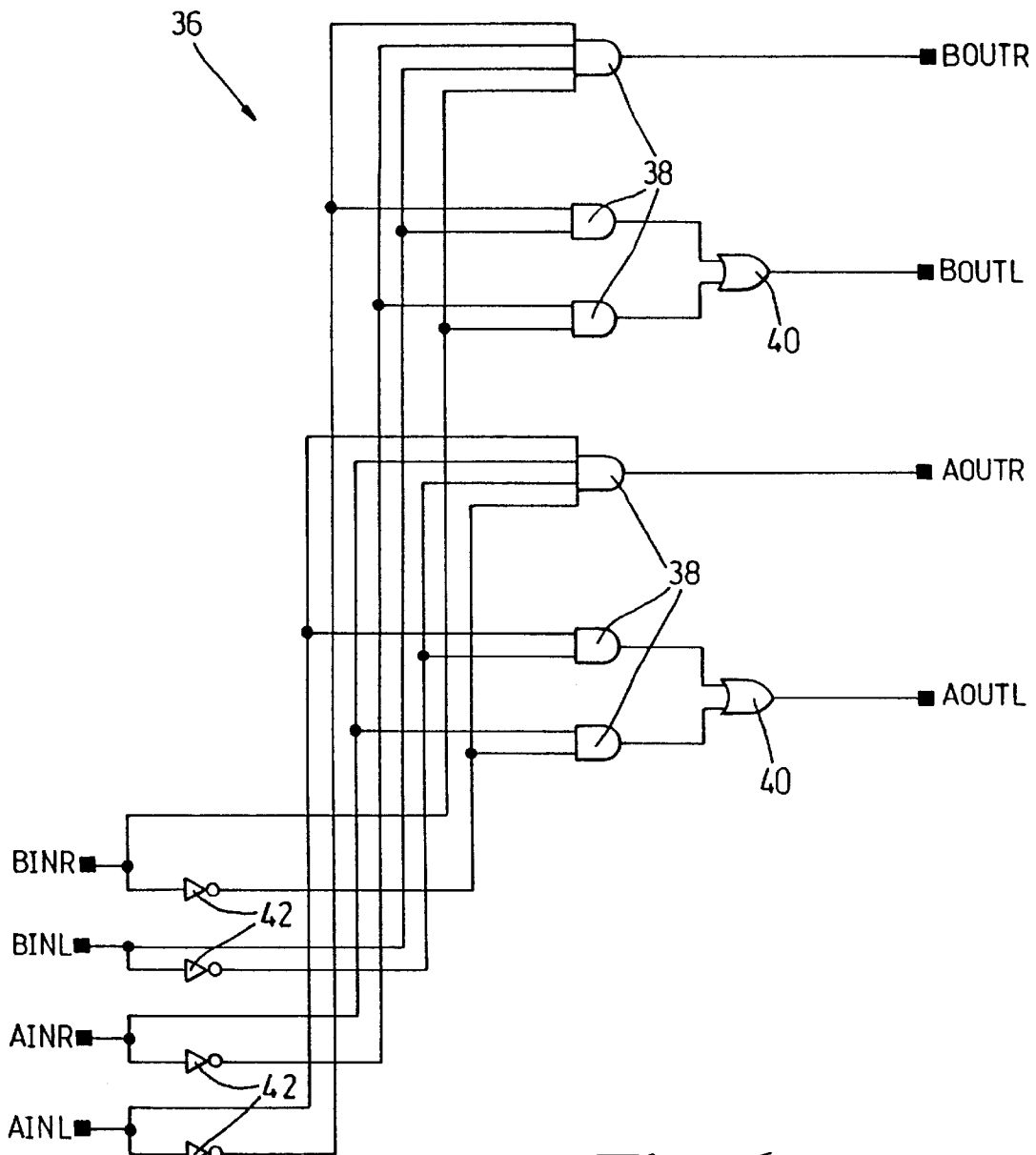
FIG. 6 is a circuit diagram of one of the bit manipulation cells of the weightless binary comparator of FIG. 5 for performing a full shift and a partial Hamming elimination.
Figure 7:
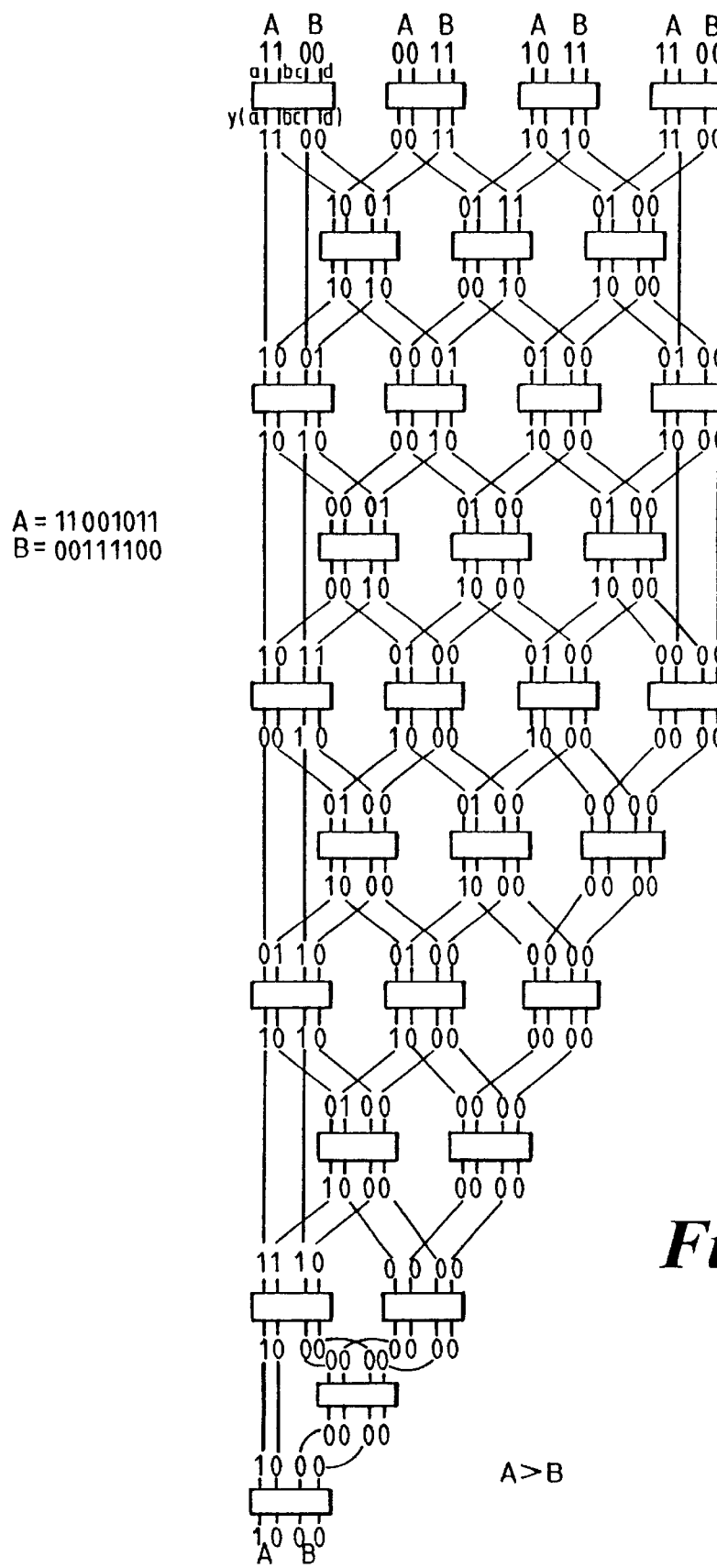
FIG. 7 is a worked example of the weightless binary comparator of FIG. 5, showing the bits set on the inputs and outputs of the bit manipulation cells in response to the input of wo typical weightless binary vectors.

Referring now to the embodiment of FIGS. 5 to 7, the array of bit manipulation cells 36 and their interconnections are the same as that of the embodiment of FIG. 5, but the logic implemented in each cell is different and the logic operations carried out on the output of the bit manipulation cell and final layout are different. The logic circuit for the bit manipulation cell 36 is shown in FIG. 6 and comprises six AND gates 38 and two OR gates 40 and four inverters 42 providing the simpler logic operations for AoutL, AoutR, BoutL, and BoutR as stated below, where q, r, s, t, represent AinL, AinR, BinL and BinR respectively. The Boolean operators "NOT", "AND" and "OR" are represented by !, & and # respectively.

$$AoutL = q \text{ \& } !s$$

$$\# r \text{ \& } !t$$

$$AoutR = q \text{ \& } r \text{ \& } !s \text{ \& } !t$$

$$BoutL = !q \text{ \& } s$$

$$\# !r \text{ \& } t$$

$$BoutR = !q \text{ \& } !r \text{ \& } s \text{ \& } t \qquad \text{(Equation set (2))}$$

The truth table is set out below in which it will be seen that, for two bits of tuples A and B, taken on an even boundary of two, the truth table performs a combinatorial full shift and partial Hamming elimination operation.

| A in L | A in R | B in L | B in R | A out L | A out R | B out L | B out R |
|--------|--------|--------|--------|---------|---------|---------|---------|
| 0 | 0 | 0 | 0 | 0 | 0 | 0 | 0 |
| 0 | 0 | 0 | 1 | 0 | 0 | 1 | 0 |
| 0 | 0 | 1 | 0 | 0 | 0 | 1 | 0 |
| 0 | 0 | 1 | 1 | 0 | 0 | 1 | 1 |
| 0 | 1 | 0 | 0 | 1 | 0 | 0 | 0 |
| 0 | 1 | 0 | 1 | 0 | 0 | 0 | 0 |
| 0 | 1 | 1 | 0 | 1 | 0 | 1 | 0 |
| 0 | 1 | 1 | 1 | 0 | 0 | 1 | 0 |
| 1 | 0 | 0 | 0 | 1 | 0 | 0 | 0 |
| 1 | 0 | 0 | 1 | 1 | 0 | 1 | 0 |
| 1 | 0 | 1 | 0 | 0 | 0 | 0 | 0 |
| 1 | 0 | 1 | 1 | 0 | 0 | 1 | 0 |
| 1 | 1 | 0 | 0 | 1 | 1 | 0 | 0 |
| 1 | 1 | 0 | 1 | 1 | 0 | 0 | 0 |
| 1 | 1 | 1 | 0 | 1 | 0 | 0 | 0 |
| 1 | 1 | 1 | 1 | 0 | 0 | 0 | 0 |

The truth table is the same as that for the previous embodiment except for the mappings of (0110) to (1010) and the mapping of (1001) to (1010). Accordingly, we refer to this arrangement as a "partial" Hamming elimination operation, that is to say set bits to either side of the A:B boundary are only cancelled if they are in the corresponding positions prior to the shift operation. Thus for example (0101) and (1010) each map to (0000), but (0110) and (1001) (which in the previous embodiment mapped to (0000)) in this embodiment each map to (1010). FIG. 7 is a worked example for comparison of a weightless tuple A(11001011) having a Hamming value of 5 and a tuple B (00111100) having a Hamming value of 4. At the final stage 65 of the manipulation cells 57, the bit set on AoutL indicates that the Hamming value of A is greater than that of B. The logic table for deriving the Hamming value relationships from AoutL and BoutL are shown in the following table:

BoutL are shown in the following table:-

| Final AoutL | Final BoutL | A > B | B > A | A = B |
|---|---|---|---|---|
| 0 | 0 | FALSE | FALSE | TRUE |
| 0 | 1 | FALSE | TRUE | FALSE |
| 1 | 0 | TRUE | FALSE | FALSE |
| 1 | 1 | FALSE | FALSE | TRUE |

It should be noted that this comparison also works with thermometer codes.

The number of cells and number of layers required depends on the width of the words to be compared and can be determined empirically, to give a stable output for all input states.

It should be appreciated that, if required, the arrangement could be made larger or smaller to deal with tuples of different length, or if required, a tuple may be added out with 0's.

The invention also extends to arrays achieving the same function using different bit manipulation cells, or employing De Morgan equivalents of the items shown. It should also be appreciated that the arrangements may use inverse logic and De Morgan equivalents. Furthermore, the invention may be extended to allow comparison of more than two binary tuples by suitable comparison and combination stages. For example three tuples A, B, and C, may be compared by making the comparison A:B, A:C and B:C and then ordering the tuples A,B,C, knowing the results of the comparisons.

The Hamming value comparators of FIGS. 2 to 7 inclusive use an array of common 2×2-bit manipulation cells operating on two bits from each tuple to determine the Hamming value relationship of two binary tuples without requiring prior conversion to thermometer code. These principles may also be modified and applied to arrangements which use bit manipulation cells which operate on more than 2 bits, hereafter referred to as n-bit cells. The generic technique for systems using n-bit cells is described below and an example is given for a 2×4-bit cell.

The general principle is that the two weightless strings (A,B) for Hamming value comparison are segmented into n-tuples, where n=2,3,4 are suitable. Larger values of n are theoretically possible, but are cumbersome to implement. If the length of the binary strings is indivisible by n, then the strings are padded with additional 0's. In the input layer, and odd layers, the tuples are split on even boundaries, whereas in the even layers the tuples are split on odd boundaries. This staggered effect is to allow set bits progressively to migrate across even and odd boundaries in successive layers. The bit position within each tuple, indeed the order of the tuples within each binary string, is irrelevant because the bits are weightless. The n-tuples comprising A and B are fed into a cellular lattice structure having a first stage which effects thermometer code conversion followed by a second stage which effects Hamming elimination. Each tuple is converted into thermometer code using a Boolean mapping as described in our co-pending U.K Patent Application No. 9726752.0.

Thus, for a two bit cell, the arrangements of FIGS. 1 to 3 employ a two bit cell in a lattice structure, but it is also possible to provide a similar structure which employs 3,4 etc bits. As noted above, for a 2 bit cell, the manipulator equations are:

$Ya = a \# b$ $Yb = a \& b,$ (Equation Set (3))

where # is the OR function and & is the AND function, a and b are the inputs, and Ya and Yb are the corresponding outputs.

For a three bit cell, with inputs a, b, c, and outputs Ya, Yb, Yc, the manipulator equations are:

$Ya = a \# b \# c$ $Yb = (b \& c) \# (a \& c) \# (a \& b)$ $Yc = a \& b \& c$ (Equation Set (4))

Similarly for a four bit cell, with inputs a, b, C, d, and outputs Ya, Yb, Yc, Yd, the manipulator equations are:

$Ya = a \# b \# c \# d$ $Yb = (d \& c) \# (d \& b) \# (d \& a) \# (c \& b) \# (c \& a) \# (b \& a)$ $Yc = (d \& c \& b) \# (d \& c \& a) \# (d \& b \& a) \# (c \& b \& a)$ $Yd = a \& b \& c \& d$ (Equation Set (5))

In the second stage, bits set in the respective bit positions of the tuples A and B are eliminated by a process referred to herein as Hamming elimination. Thus the thermometer coded tuples A and B (1100) (1000), become (0100) and (0000) respectively. The Boolean equation that performs this Hamming elimination at each bit position is ya=a &!b for the A tuples, and yb=b & !a for the B tuples. Examples of the complete cell, for n=2 and n=4 are given with FIG. 8 showing a dual 2 input structure (identical to the structure of FIG. 3(b), and FIG. 9 showing a dual 4 input structure.

Figure 8:
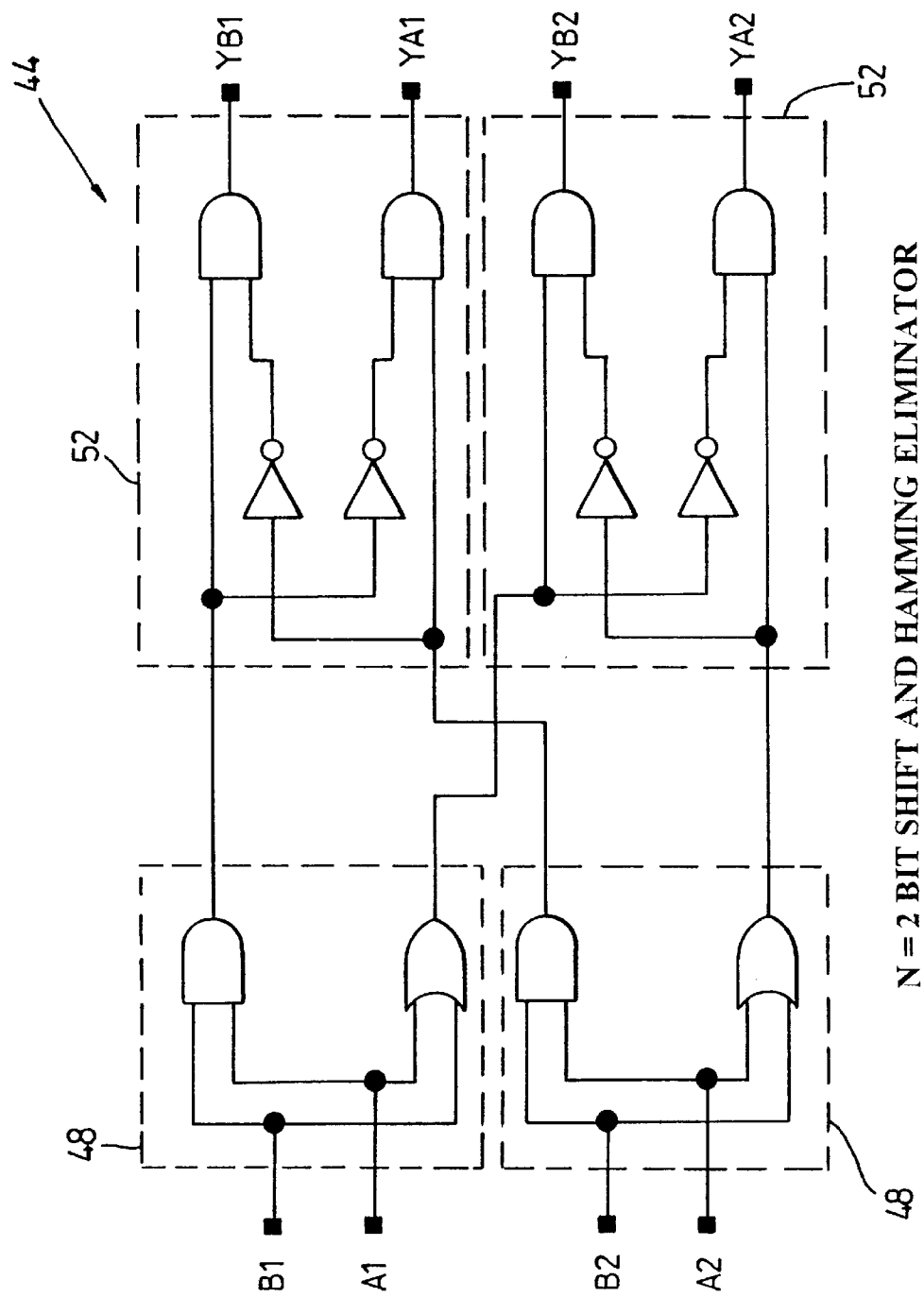
FIG. 8 is a circuit diagram of a 2×2-bit manipulator cell for performing shift and Hamming elimination.
Figure 9:
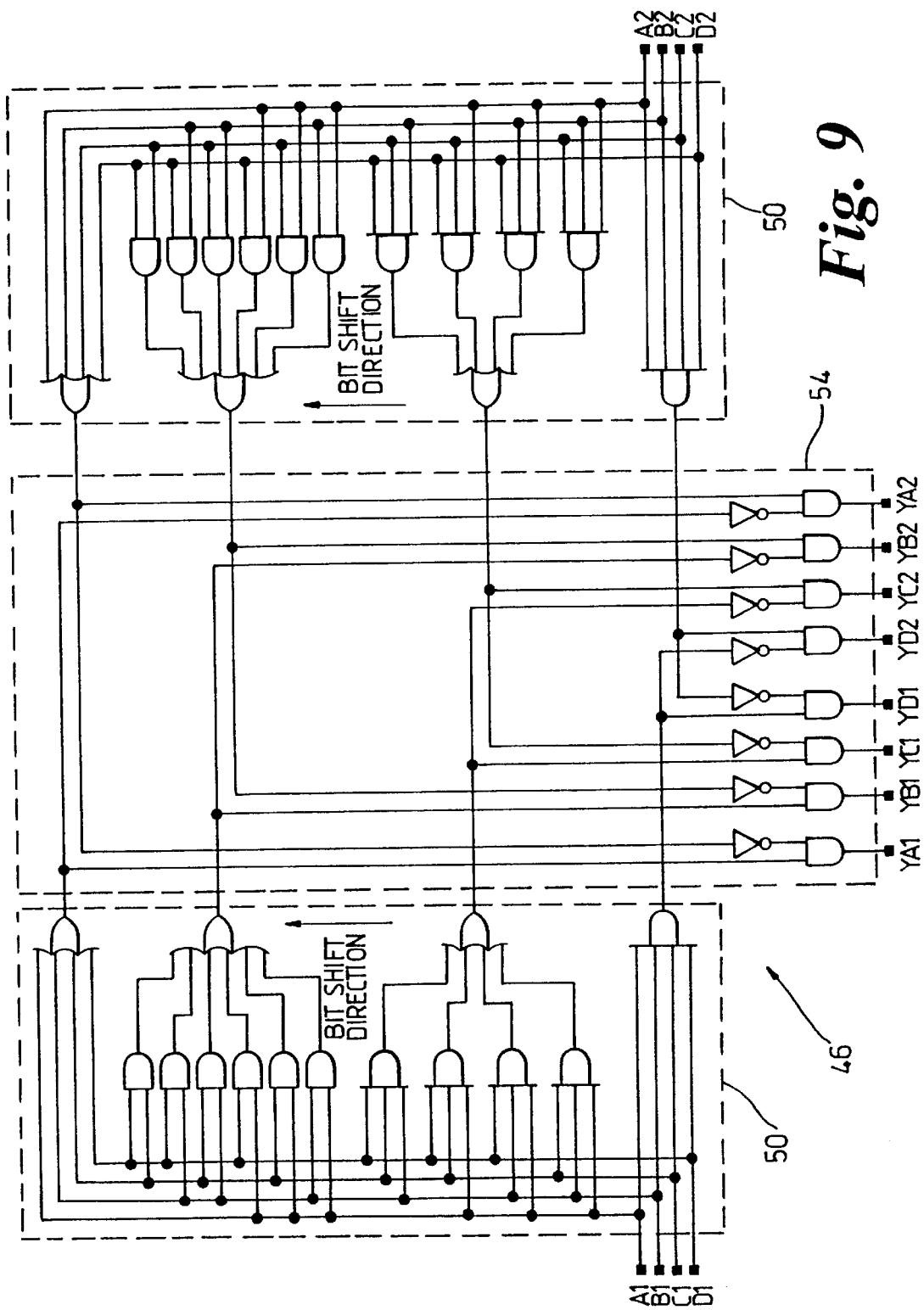
FIG. 9 is a circuit diagram of a 2×4-bit manipulator cell performing shift and Hamming Elimination.

Inspection of FIGS. 8 and 9 shows that each structure 44, 46 respectively includes a first stage 48, 50, of AND and OR gates, structure 44 also including inverters which effects the conversion into thermometer code and a second stage 52, 54 which effects the Hamming Elimination. The second stages of each are similar, and the similarity in this aspect with the arrays 12 and 14 of FIG. 1 will be apparent. Likewise the similarity of the first stage of the two input structure and the four input structure to the thermometer code converter structure of U.K. Patent Application No. 9726752.0 will be noted.

Figure 10:
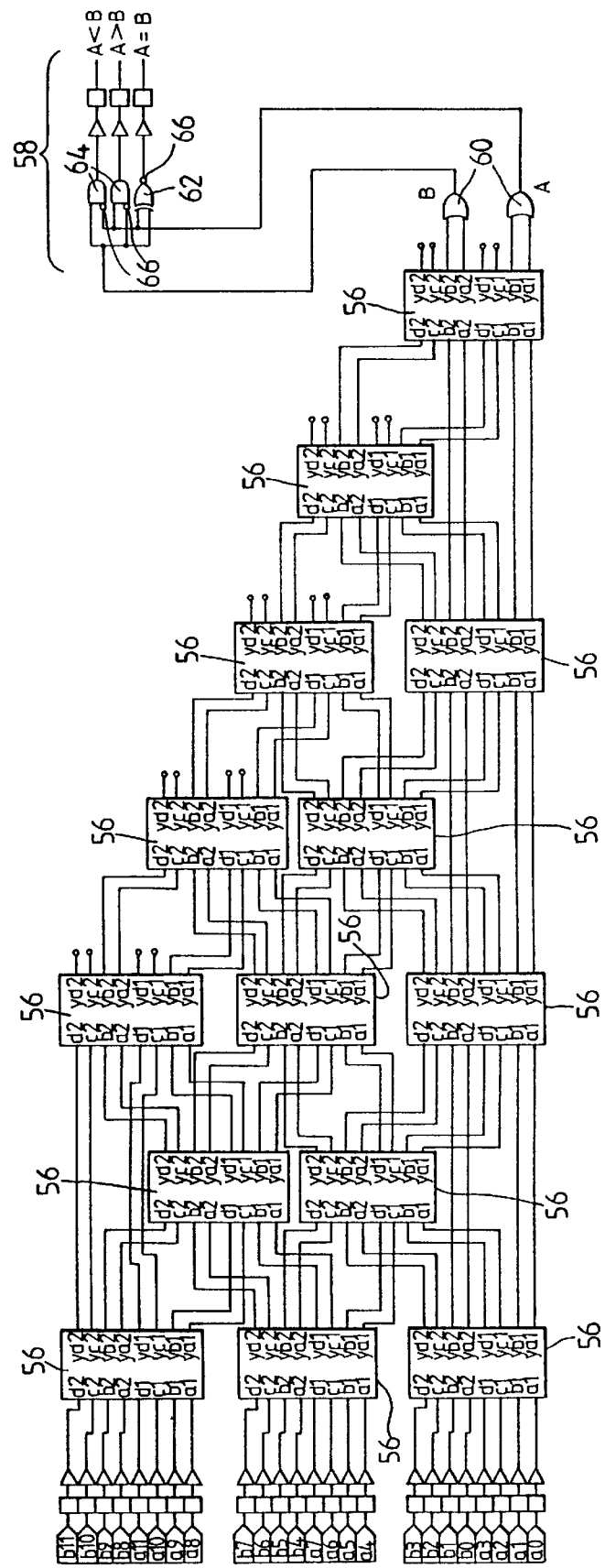
FIG. 10 is a circuit diagram of an array of the manipulation cells of FIG. 9 providing a Hamming value comparator for comparing two 12-bit weightless inputs.

A lattice structure of bit cell manipulators is then formed to execute the Boolean processes in parallel. FIG. 10 shows an example for a Hamming value comparator made up of an array of 2×4-bit manipulation cells 56 of the type illustrated in FIG. 9, to compare the Hamming values of two 12-bit words A (comprising bits $a_0 \ldots a_{11}$) and B (comprising bits $b_0 \ldots b_{11}$) In this array, the inputs and outputs are rearranged so that they are in line instead of at 90° as in FIG. 9, but the logical operations are unchanged. As previously the structure has alternate odd and even layers of bit manipulation cells 56 and the cells in adjacent layers are staggered to provide an offset or overlap, to ensure that the set bits migrate through the array as required. The array is truncated as before, and respective two's of the outputs from the final cell are ORed together at a final stage decoder 58. If a bit is set on the output marked "B" but not on that marked "A", then the Hamming value of B is greater than that for A. If a bit is set on the output marked "A" but not on that marked "B", then the Hamming value of B is less than that for A. If the bits on the outputs marked "A" and "B" are the same, then the Hamming values of A and B are the same.

Figure 11:
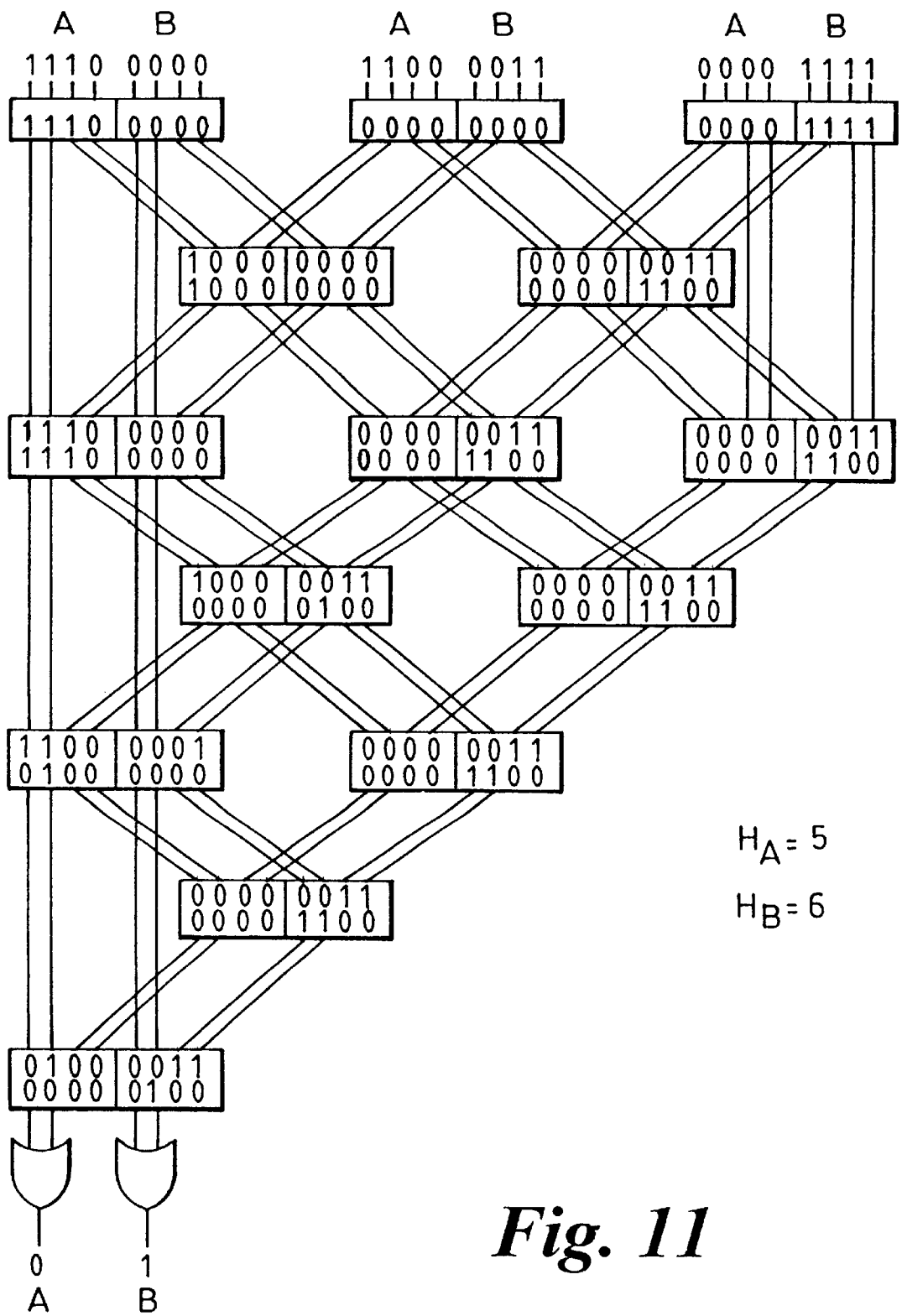
FIG. 11 is a worked example of the array of FIG. 12.

Accordingly, at the decoder 58 the OR, EX-NOR, and AND gates 60, 62, 64 and the inverters 66 set the appropriate bit on one of the decoder outputs A less than B (A<B), A greater than B (A>B) or A equal to B (A=B). FIG. 11 is a worked example for the circuit of FIG. 10, comparing two twelve bit binary tuples (111011000000) and (000000111111) respectively and determining the correct result.

Figure 12:
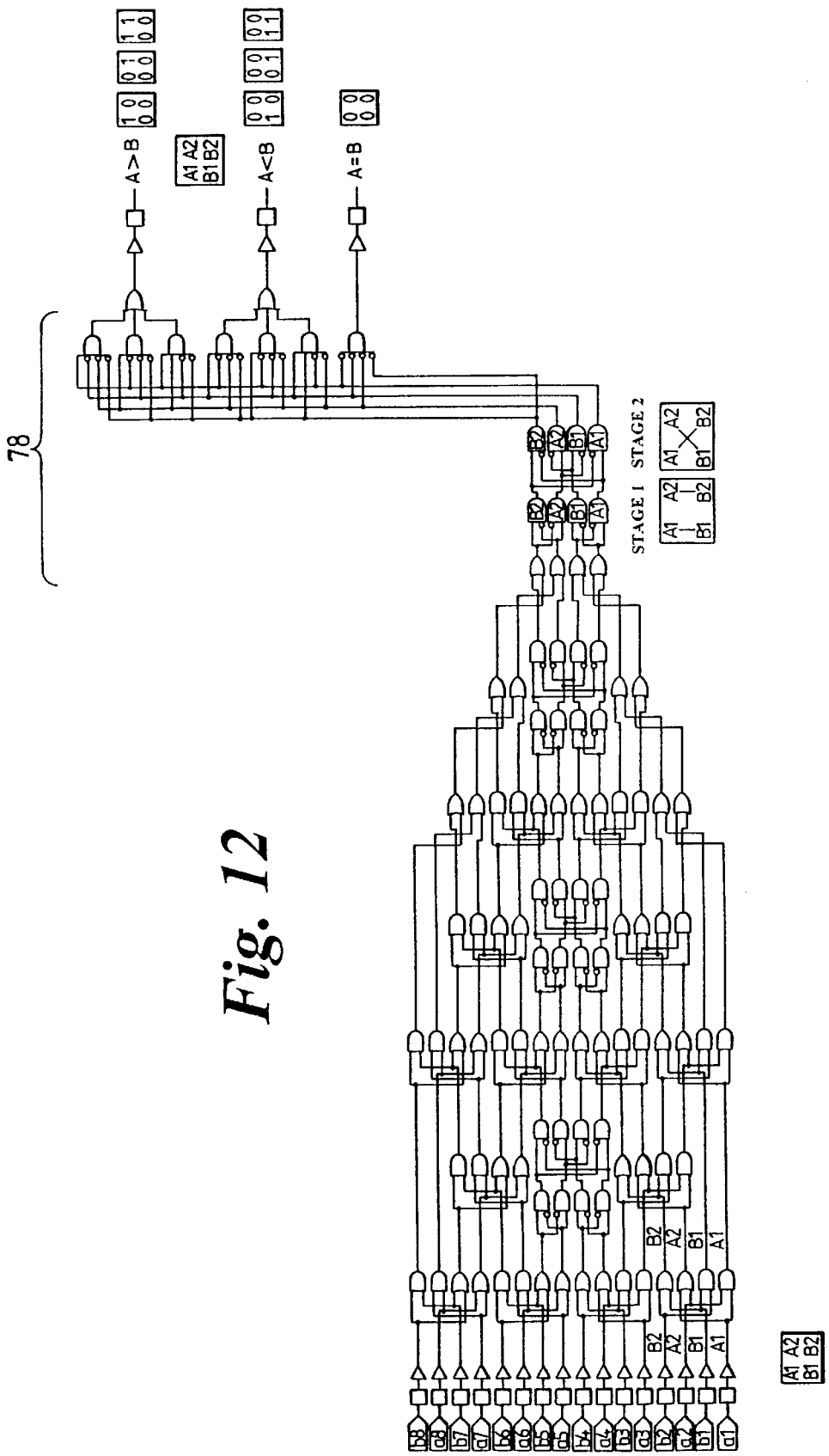
FIG. 12 is a further embodiment of a Hamming value, comparator for comparing two 8-bit weightless inputs.
Figure 14:
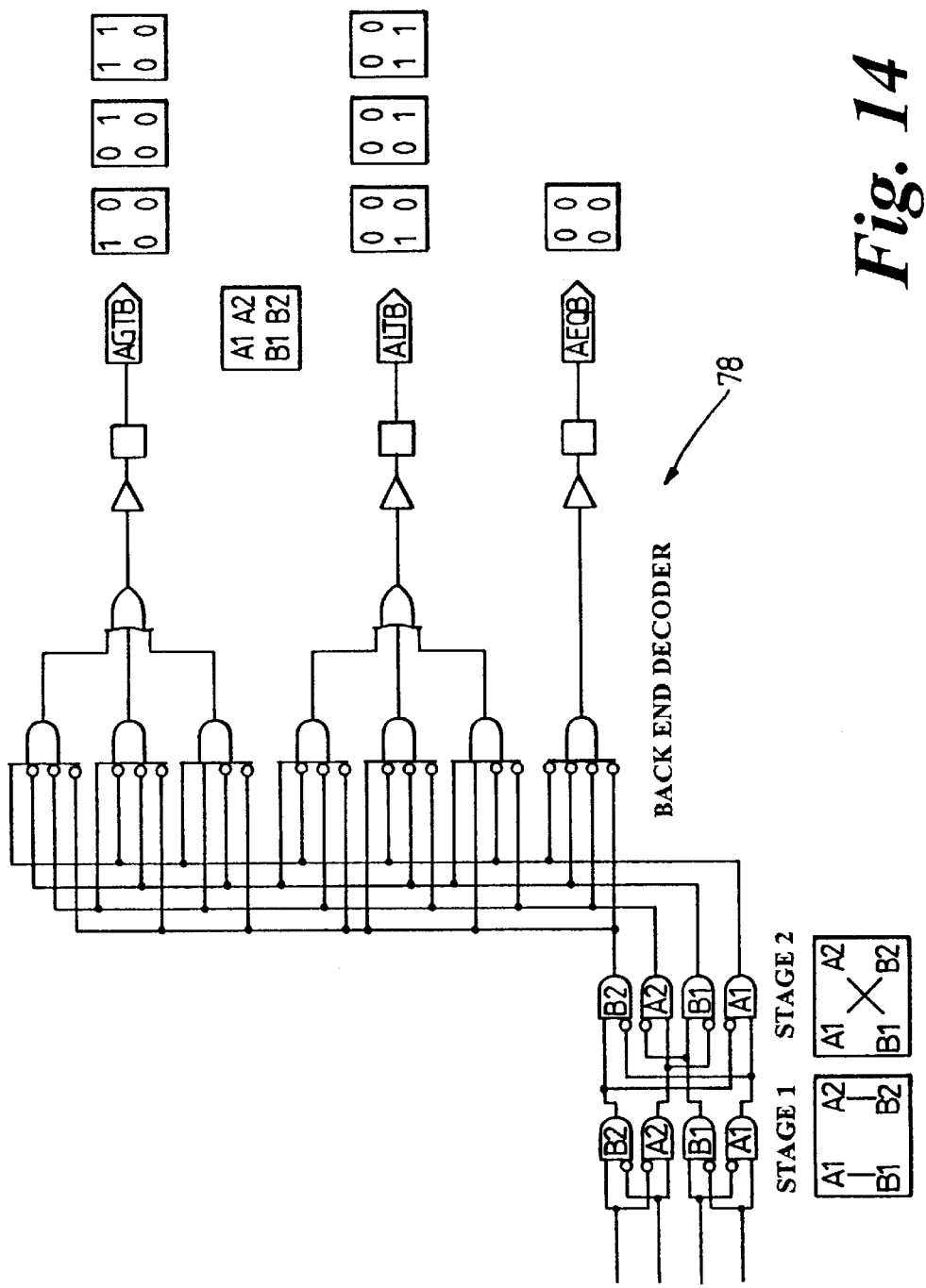
FIG. 14 is an enlarged view of the back end decoder used in the embodiment of FIG. 12.

It is also possible to design comparators which shift and compare towards the centre of the strings. This design is faster and uses less logic. Referring now to FIGS. 12, to 14, there is illustrated an embodiment of Hamming value comparator which uses an array of 2×2-bit manipulation cells taking two bits from each binary tuple—here each of eight bits—and performing shift and elimination operations. In this arrangement the bits are shifted towards the middle of the tuple rather than to one end. The similarities with the original 2-bit manipulation cell will be apparent.

Figure 13:
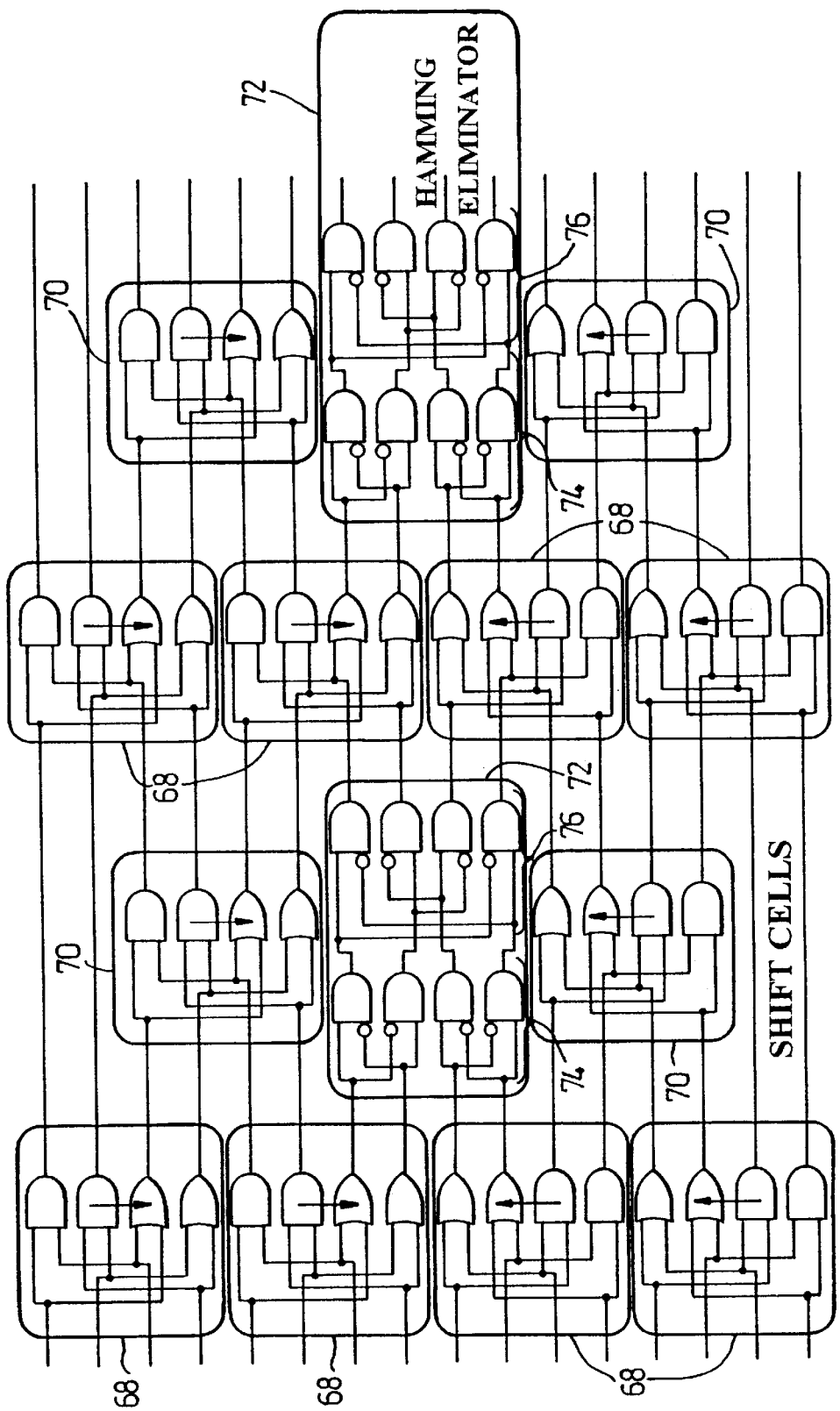
FIG. 13 is an enlarged view of part of FIG. 12 for explaining the structure thereof.

It will be noted from the representation in FIG. 13 that the array is made up of a number of cells designated respectively as odd shift cells 68, even shift cells 70 and Hamming Elimination blocks 72. The odd and even shift cells 68 are symmetrically placed about the mid-line of the array, with shift cells below the mid line shifting upwards and shift cells above the mid line shifting downwards. The Hamming Elimination blocks 72 are located on the array mid line and are special manipulation cells operating on four bits organised as a block of 2×2 bits and made up of a AND gates with selected inputs inverted as shown. The elimination comprises a vertical stage 74 and a cross stage 76 and the stages can be in either order with reference to the schematic representation in FIGS. 12 or 14, the following operations apply, with the inputs and outputs of the array being designated (A1,A2,B1,B2) reading from the bottom to the top of the cell as viewed:

If A1 and B1 are 1 they will both become 0 (vertical)
If A1 and B2 are 1 they will both become 0 (vertical)
If A1 and B2 are 1 they will both become 0 (cross)
If A2 and B1 are 1 they will both become 0 (cross)
with any other values passing straight through.

A backend decoder 78 is required to provide the A>B, A<B and A=B outputs from the values received from the final Hamming Elimination block and the logic circuits for this are shown in FIGS. 12 and 14.

Planar Hamming Value Comparator

Referring now to the embodiment of FIGS. 15 to 19, there is illustrated a Boolean lattice structure for planar Hamming value comparison. The arrangements described above with reference to FIGS. 1 to 14 effect the Hamming value comparison of 1-dimensional strings of weightless binary bits of various word lengths using an array of manipulation cells which perform a full or partial shift and full or partial bit elimination operation on selected bits from the two 1-dimensional strings. This technique has been developed to provide an arrangement for comparing the Hamming value relationships of two equally sized square weightless arrays.

Figure 15:
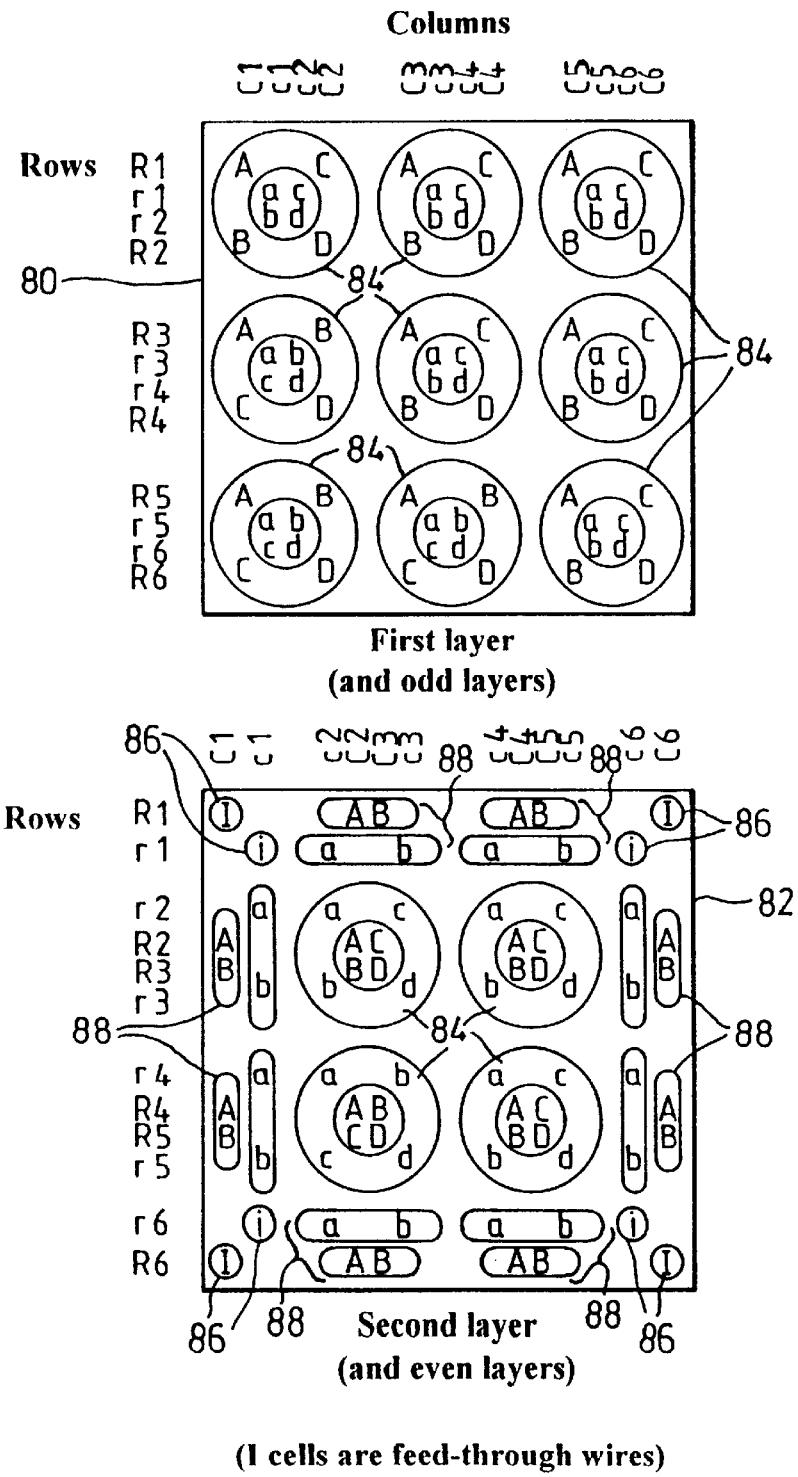
FIG. 15 is a diagrammatic representation of the odd and even layers, and the cell number identification used in an embodiment of a planar Hamming value comparator structure.

Referring to FIG. 15, the planar Hamming value device is made up of alternate odd and even layers 80, 82. Each layer in this example processes a first array of 6×6 bits (identified by nine lots of capital letters (A, B, C, D) and coordinates $R_1$ to $R_6$ and $C_1$ to $C_6$) and a second array of bits (identified by nine lots of lowercase letters (a, b, c, d) and coordinates $r_1$ to $r_6$, $c_1$ to $c_6$). Each layer effects a shift of set bits towards the upper top left corner as viewed. Each layer also effects a Hamming Elimination between the arrays, similar to that performed in the 1-dimensional arrays, and as to be illustrated below, so that in successive layers the bits are shifted to the top left hand corner of the array and Hamming elimination is performed. Eventually, in the final layer a single bit at the output indicates the Hamming value relationship of the two arrays.

It should be noted that each layer is symmetrical about the diagonal running from top left to bottom right, with the cells on and above the diagonal running:

$$\begin{pmatrix} A & C \\ B & D \end{pmatrix}$$

and those below running:

$$\begin{pmatrix} A & B \\ C & D \end{pmatrix}$$

In the first layer 80, each 6×6 array of inputs is segregated into nine 2×2 tuples. For one input array there are nine tuples each identified {a, b, c, d} (though a, b, c, d will not usually be the same between tuples), and for the other array there are nine tuples {A,B,C,D}.

Figure 17:
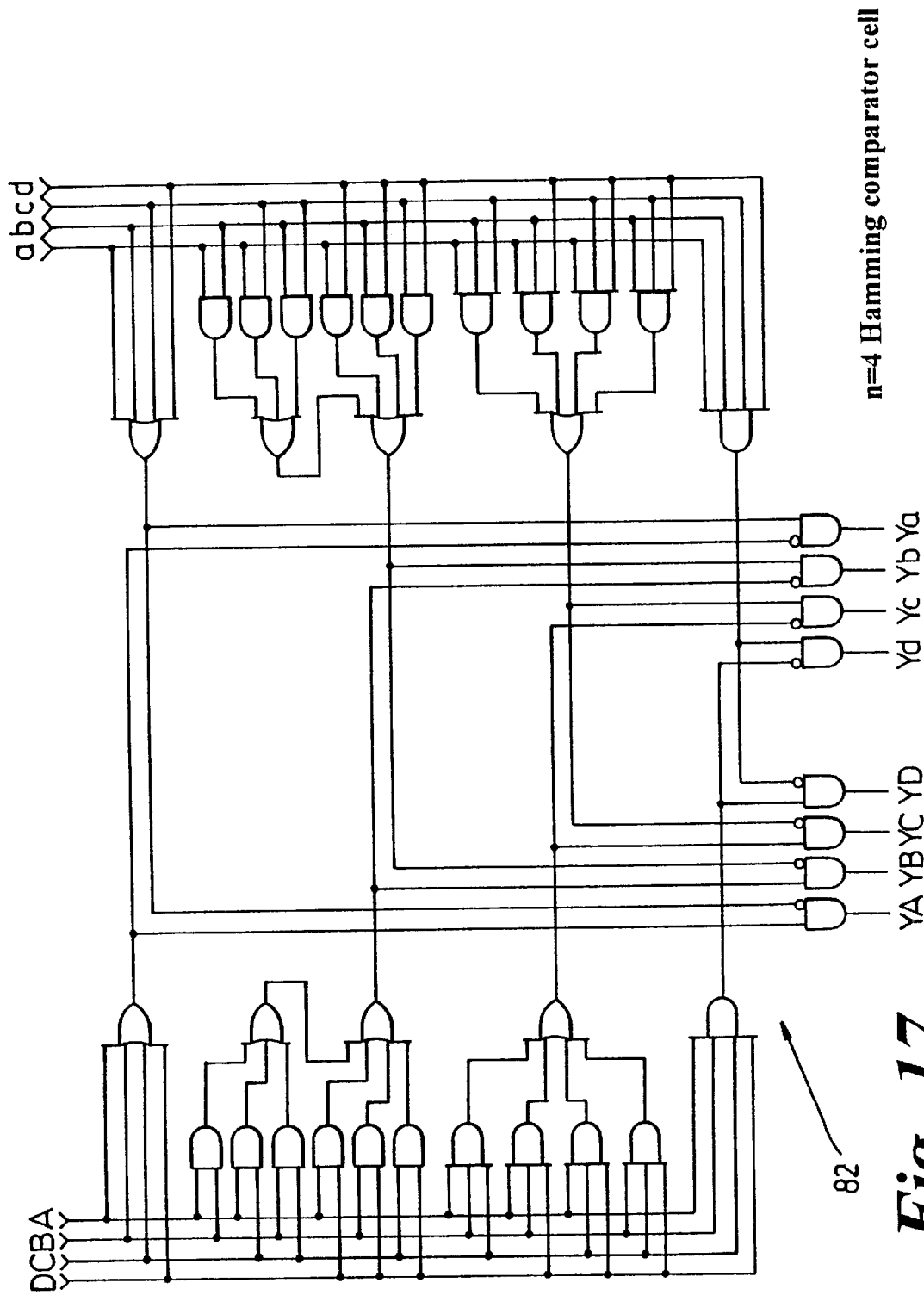
FIG. 17 is a diagram of a 2×4-bit manipulation cell for use in the embodiment of Planar Hamming value comparator of FIG. 15.

In the first layer, two lots of 2×2 tuples from the same part of the input arrays are combined, as indicated by the concentric arrangement. Thus at each tuple position the tuples {a, b, c, d} in the centre and the tuples {A,B,C,D} around the centre are processed together so that, in effect, the first layer 80 is made up of an array of nine 8-bit manipulator cells 84. The 8-bit manipulation cell 84 is shown in FIG. 17 and is the same as that shown in FIG. 9 above except, for aiding understanding, the labelling has been changed to reflect the identification of the tuples by capital and lower-case letters. The 8-bit manipulation cell receives the two tuples {a,b,c,d} and {A,B,C,D}, performs a shift and elimination operation and outputs the result as tuples {Ya, Yb, Yc, Yd} and {YA, YB, YC, YD}. The same operations are performed in all of the other odd layers.

Figure 16:
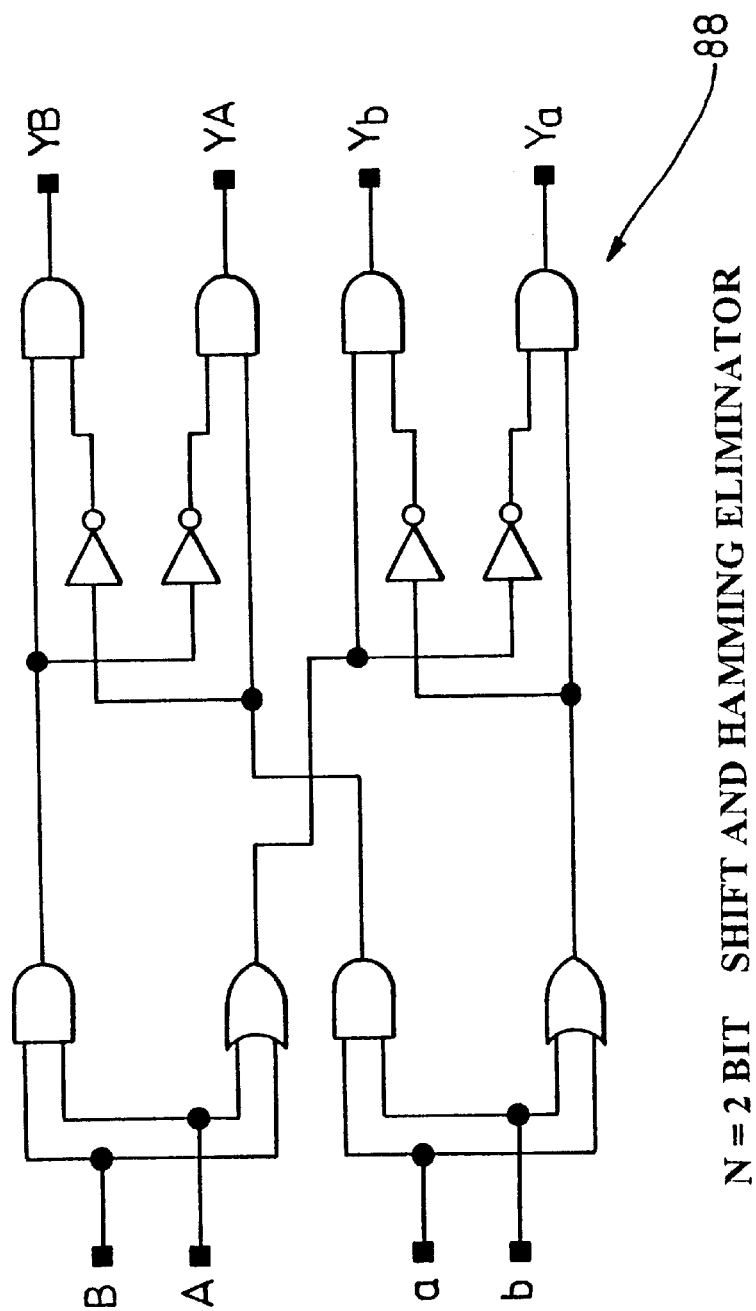
FIG. 16 is a diagram of the 2×2-bit manipulation cell used in the embodiment of the planar Hamming value comparator structure of FIG. 15.

In the second and even layers 82, there is an offset and overlap, and feedthrough 86 at the four corners. To achieve the required offset and overlap, in this example the even layers are made up of four 8-bit manipulator cells 84 of the type used in the odd layers, grouped centrally and symmetric about the usual top left to bottom right diagonal, and eight peripheral 4-bit manipulator cells 88 spaced about the periphery, and eight feedthroughs 86 at the corners. The 4-bit manipulation cells in the even layers operate on two tuples {A, B} and {a,b}, performing a shift and Hamming elimination as described in Equation Set (1). FIG. 16 shows the logic circuit of earlier FIGS. 3 and 8 labelled with {A,B} and {a,b} input tuples and {YA,YB} {Ya Yb} output tuples respectively.

Thus a bit with coordinates ($C_m$, $R_n$) in an odd layer will map to ($C_m$, $R_n$) in the even layer, and ($c_m$, $r_n$) in an odd layer will map to ($c_m$, $r_n$) in an even layer. So, for example, the outputs in the top right of the first layer with co-ordinates $C_6,R_1$) and ($c_6$, $r_1$) will be YC and Yc respectively as viewed in FIG. 17. The elements at these co-ordinates in the second layer are feedthroughs 86, and so YC and Yc will pass unchanged through the second layer to form the "C" and "c" inputs to the top right hand manipulation cell 84 in the third layer. The mapping of the other first layer outputs to the second or subsequent layer inputs can be readily determined in a similar manner.

FIGS. 18 and 19 show worked examples for the 6×6 planar Hamming value structure just described, for two sets of 6×6 inputs respectively. It should be noted that in FIG. 18, the output is stable after five layers, whereas FIG. 19 a stable output is achieved after six layers.

In FIG. 18, the miner array of inputs (i.e. the lower case array of FIG. 15) has a Hamming value of 18, whereas the outer array of inputs (i.e. the Capital letter array of FIG. 15) has a Hamming value of 14. The outputs of each of the layers are shown together with the respective Hamming values, resulting from elimination, for each array. The output of the array is read by monitoring the bits at positions ($C_1$, $R_1$) and ($c_1$, $r_1$). If the Hamming value of the capital letter array is greater, then at the output of the final layer the bit at ($C_1$, $R_1$) will be set (as in FIG. 19(b)). If the Hamming value of the lowercase array is greater, then the bit at position ($c_1$, $r_1$) will be set (as in FIG. 18). If the bits at both positions are the same, this indicates that the Hamming values of both arrays are the same.

FIGS. 15 to 17 above show an example of a cell layering structure for operating on two 6×6 arrays of bits. It is however possible to provide structures for smaller or larger arrays using the same general principles. If desired, larger operating blocks may be used instead of the 8 bit blocks used in this example.

Figures 19B, 20:
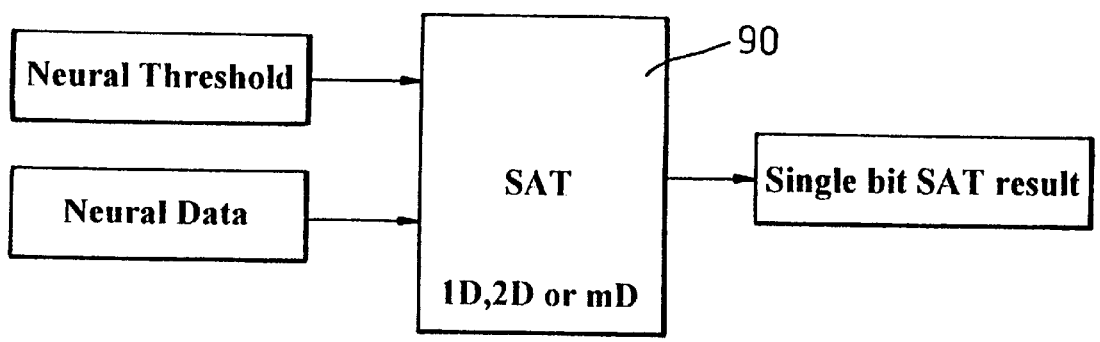
FIG. 20 is a diagram of a sum and threshold (SAT)device which may be constructed by a Hamming value comparator as described herein.

It should be noted that the techniques described above with respect to aggregate code formation and planar Hamming value structure can be extended beyond two dimensional arrays to provide three and higher dimensional arrays (cubic and hyperplane systems). The Hamming value comparators described above may be used to perform a sum-and-threshold (SAT) function in existing and novel weightless neural networks. As shown in FIG. 20, a tuple of neural data, and a tuple defining a neural threshold may be supplied to a Hamming value comparator 90 of one of the types discussed above, whether of one, two or of greater dimension. The relevant output of the comparator is then checked to see whether a bit is set on the output which indicates that the neural data has exceeded the neural threshold. The relevant output is then viewed as the single output of the neuron which is taken to have "fired" if the bit has set. Naturally one of the other outputs could be monitored if the neuron was intended to respond to another condition.

What is claimed is:

1. A Hamming value comparator for determining the Hamming value relationship of two one or more dimensional arrays of bits, which comprises means for applying said arrays to one or more bit manipulation cells each cell for receiving respective tuples from each of said arrays, and each cell including bit transformation means which perform an asynchronous Boolean bit shift operation on each of said tuples to shift said bits therein in a predetermined direction and also perform an asynchronous Boolean elimination operation in which set bits in corresponding bit positions in said tuples are unset, thereby to determine the Hamming value relationship of said arrays.

2. A Hamming value comparator, for determining the Hamming value relationship of two one or more dimensional arrays of bits, which comprises means for applying said arrays to one or more bit manipulation cells or logic elements for performing at least one of a shift operation and a bit elimination operation to determine the Hamming value relationship of said arrays which comprises processing means comprising a plurality of layers of bit manipulation cells each cell having a plurality of inputs and a plurality of outputs, input means for passing corresponding bits from each of the two binary arrays to respective inputs of bit manipulation cells in the first layer of said processing means, the bit manipulation cells being interconnected by passing the outputs of each layer apart from the last to respective inputs of the next or next-but-one layer, thereby to provide an output indicative of said Hamming relationship.

3. A Hamming value comparator according to claim 2, wherein each bit manipulation cell includes four inputs and four outputs, and the bit manipulation cells in said first layer are arranged such that, for each bit manipulation cell, two inputs each receive a respective bit from one of said binary arrays and the other two inputs each receive a respective bit from the other binary array.

4. A Hamming value comparator according to claim 3, wherein each of said two inputs in the bit manipulation cells in said first layer receive adjacent bits of the corresponding binary array, taken on an even boundary.

5. A Hamming value comparator according to claim 4, wherein each manipulation cell performs an operation on the bits from said first and second binary arrays received at the respective inputs, whereby a set bit is shifted towards a preset bit direction and correspondingly positioned set bits are fully or partially eliminated.

6. A Hamming value comparator according claim 3, wherein each of said bit manipulation cells has a truth table substantially as set out below (or the inverse thereof):

| A in L | A in R | B in L | B in R | A out L | A out R | B out L | B out R |
|---|---|---|---|---|---|---|---|
| 0 | 0 | 0 | 0 | 0 | 0 | 0 | 0 |
| 0 | 0 | 0 | 1 | 0 | 0 | 1 | 0 |
| 0 | 0 | 1 | 0 | 0 | 0 | 1 | 0 |
| 0 | 0 | 1 | 1 | 0 | 0 | 1 | 1 |
| 0 | 1 | 0 | 0 | 1 | 0 | 0 | 0 |
| 0 | 1 | 0 | 1 | 0 | 0 | 0 | 0 |
| 0 | 1 | 1 | 0 | 0 | 0 | 0 | 0 |
| 0 | 1 | 1 | 1 | 0 | 0 | 1 | 0 |
| 1 | 0 | 0 | 0 | 1 | 0 | 0 | 0 |
| 1 | 0 | 0 | 1 | 0 | 0 | 0 | 0 |
| 1 | 0 | 1 | 0 | 0 | 0 | 0 | 0 |
| 1 | 0 | 1 | 1 | 0 | 0 | 1 | 0 |
| 1 | 1 | 0 | 0 | 1 | 1 | 0 | 0 |
| 1 | 1 | 0 | 1 | 1 | 0 | 0 | 0 |
| 1 | 1 | 1 | 0 | 1 | 0 | 0 | 0 |
| 1 | 1 | 1 | 1 | 0 | 0 | 0 | 0 | wherein AinL, AinR, BinL, BinR, are the four inputs to the cell and AoutL, AoutR, BoutL, BoutR are the four outputs.

7. A Hamming value comparator according to claim 3, wherein each of said bit manipulation cells has a truth table substantially as set out below (or the inverse thereof):

| A in L | A in R | B in L | B in R | A out L | A out R | B out L | B out R |
|---|---|---|---|---|---|---|---|
| 0 | 0 | 0 | 0 | 0 | 0 | 0 | 0 |
| 0 | 0 | 0 | 1 | 0 | 0 | 1 | 0 |
| 0 | 0 | 1 | 0 | 0 | 0 | 1 | 0 |
| 0 | 0 | 1 | 1 | 0 | 0 | 1 | 1 |
| 0 | 1 | 0 | 0 | 1 | 0 | 0 | 0 |
| 0 | 1 | 0 | 1 | 0 | 0 | 0 | 0 |
| 0 | 1 | 1 | 0 | 1 | 0 | 1 | 0 |
| 0 | 1 | 1 | 1 | 0 | 0 | 1 | 0 |
| 1 | 0 | 0 | 0 | 1 | 0 | 0 | 0 |
| 1 | 0 | 0 | 1 | 1 | 0 | 1 | 0 |
| 1 | 0 | 1 | 0 | 0 | 0 | 0 | 0 |
| 1 | 0 | 1 | 1 | 0 | 0 | 1 | 0 |
| 1 | 1 | 0 | 0 | 1 | 1 | 0 | 0 |
| 1 | 1 | 0 | 1 | 1 | 0 | 0 | 0 |
| 1 | 1 | 1 | 0 | 1 | 0 | 0 | 0 |
| 1 | 1 | 1 | 1 | 0 | 0 | 0 | 0 |

8. A Hamming value comparator for determining the Hamming value relationship of two one or more dimensional arrays of bits, which comprises means for applying said arrays to one or more bit manipulation cells or logic elements for performing at least one of a shift operation and a bit elimination operation to determine the Hamming value relationship of said arrays wherein each bit manipulation cell has a first plurality of inputs for receiving respective bits from one of said binary arrays and a second plurality of inputs for receiving respective bits from the other of said binary arrays, and said bit manipulation cell has a corresponding plurality of outputs, and logic means for outputting on a pre-selected one of said outputs a set bit if the Hamming value of the bits set on said first plurality of inputs is greater than the Hamming value of the bits set on said second plurality of inputs.

9. A Hamming value comparator for determining the Hamming value relationship of two one or more dimensional binary arrays, which comprises a bit manipulation cell having a first plurality of inputs for receiving respective bits from one of said binary arrays and a second plurality of inputs for receiving respective bits is from the other of said binary arrays, wherein said bit manipulation cell has a corresponding plurality of outputs, and logic means for outputting on a pre-selected one of said outputs a set bit if the Hamming value of the bits set on said first plurality of inputs is greater than the Hamming value of the bits set on said second plurality of inputs.

10. A Hamming value comparator for comparing two one or more dimensional binary arrays which comprises means for applying said arrays to one or more bit manipulation cells or logic elements for performing at least one of a shift operation and a bit elimination operation to determine the Hamming value relationship of said arrays and comprising a plurality of alternate layers of manipulation cells, one of said layers comprising a plurality of first bit manipulation cells for shifting set bits in the input arrays towards a pre-set position, others of said layers comprising a plurality of said first bit manipulation cells, in combination with a Hamming Elimination cell for eliminating corresponding set bits in each of said arrays.

11. A planar Hamming value comparator, for comparing the Hamming values of two 2-dimensional arrays of binary data, which comprises means for applying said arrays to one or more bit manipulation cells or logic elements for performing at least one of a shift operation and a bit elimination operation to determine the Hamming value relationship of said arrays, said comparator comprising a plurality of layers of bit manipulation cells, each cell including at least two inputs and two outputs and being adapted to shift set bits towards a preset bit position, and being interconnected between layers to effect at least one of bit shifting and bit elimination, thereby to obtain an output indicative of the Hamming value relationship of said arrays.

12. A planar Hamming value comparator according to claim 11, wherein said comparator comprises alternate layers, ones of said layers comprising an array of 4+4 bit manipulation cells, and others of said layers comprising an array of said 4+4 bit manipulation cells, a plurality of 2+2 bit manipulation cells disposed peripherally, and a plurality of passthroughs.

13. A Hamming value comparator according to claim 12, wherein the bit manipulation cells in each layer are configured to shift the bits towards a common axis or focal point relative to said layer.

14. A Hamming value comparator according to claim 12, wherein said 2+2 bit manipulation cells perform the logic operations substantially as set out below, with inputs a,b,c,d, and outputs Ya, Yb, Yc, Yd:

$Ya = a \# b \# c \# d$ $Yb = (d \& c) \# (d \& b) \# (d \& a) \# (c \& b) \# (c \& a) \# (b \& a)$ $Yc = (d \& c \& b) \# (d \& c \& a) \# (d \& b \& a) \# (c \& b \& a)$ $Yd = a \& b \& c \& d$ (Equation Set (4)).

15. A Hamming value comparator according to claim 12, wherein said 4+4 bit manipulation cell performs the logic operations substantially as set out in FIG. 17.

16. A Hamming value comparator for determining the Hamming relationship of two thermometer codes, which comparator comprises an array of logic elements corresponding to the bit positions of the two thermometer codes, each logic element receiving the bits from the two thermometer codes at a respective bit position and comparing the bits of the thermometer codes, the array providing an output indicative of the Hamming value relationship of said thermometer codes.

17. A Hamming value comparator according to claim 16, wherein said array of logic elements provides an output indicative of whether a given one of said thermometer codes has a bit set at a position in which a corresponding bit of the other thermometer code is not set.

18. A Hamming value comparator according to claim 17, including a further array of logic elements for providing an output indicative of whether the other thermometer code has a bit set at a position in which the corresponding bit of said first thermometer code is not set.

19. A Hamming value comparator according to claim 17, wherein the or each array of logic elements comprises an array of gates each having two inputs to which the corresponding bits at a respective position in the thermometer codes are supplied.

20. A Hamming value comparator according to claim 19, wherein each of said gates comprises an AND gate with one input inverted, or the De Morgan equivalent thereof.

21. A binary sum and threshold device comprising a Hamming value comparator for determining the Hamming value relationship of two one or more dimensional arrays of bits, which comprises means for applying said arrays to one or more bit manipulation cells or logic elements for performing at least one of a shift operation and a bit elimination operation to determine the Hamming value relationship of said arrays.

22. A method of determining the Hamming value relationship of two thermometer codes, which comprises supplying said codes to an array of logic elements corresponding to the bit positions of said two thermometer codes each said logic element receiving the bit from the two thermometer codes at a respective bit position and comparing the bits of the thermometer codes, the array providing an output indicative of the Hamming value relationship.

23. A method of determining the Hamming value relationship of two thermometer codes which comprises performing an elimination function at each bit position, wherein at each bit position, the corresponding bits of the thermometer codes are compared and unset if both bits are set, and the Hamming value relationship determined on the basis of which if either codes has a bit set after performance of said elimination function.

24. A method of determining the Hamming value relationship of two one or higher dimensional arrays of bits, which comprises applying said arrays to a series of one or more bit manipulation cells each for receiving respective tuples from each of said arrays, and each including bit transformation means which perform an asynchronous Boolean bit shift operation on each of said tuples to shift said bits therein in a predetermined direction and also perform an asynchronous Boolean elimination operation in which set bits in corresponding bit positions in said tuples are unset, thereby to determine the Hamming value relationship of said arrays.

25. A binary sum and threshold device comprising a Hamming value comparator for determining the Hamming value relationship of two one or more dimensional arrays of bits, which comprises means for applying said arrays to one or more bit manipulation cells or logic elements for performing at least one of an asynchronous Boolean shift operation and an asynchronous Boolean bit elimination operation to determine the Hamming value relationship of said arrays.

26. A method of determining the Hamming value relationship of two thermometer codes, said method comprising:

supplying said codes to an array of logic elements corresponding to the bit positions of said two thermometer codes, each said logic element receiving the bit from the two thermometer codes at a respective bit position; and using Boolean logic to compare the bits of the thermometer codes, the array providing an output indicating the Hamming Value relationship of the two thermometer codes where Hamming Value relationship is defined as an indication that one of said thermometer codes is greater than, less than or equal to the Hamming Value of the other of said two thermometer codes.

27. A Hamming value comparator for determining the Hamming value relationship of two one or more dimensional arrays of bits, said comparator comprising an input circuit for applying said arrays to one or more bit manipulation cells, each cell receiving respective tuples from each of said arrays, and each cell performing an asynchronous Boolean bit shift operation on each of said tuples to shift said bits therein in a predetermined direction and also performing an asynchronous Boolean elimination operation in which set bits in corresponding bit positions in said tuples are unset, thereby to determine the Hamming value relationship of said arrays.

28. A Hamming value comparator, for determining the Hamming value relationship of two one or more dimensional arrays of bits, said comparator comprising an input circuit for applying said arrays to one or more bit manipulation cells or logic elements for performing at least one of a shift operation and a bit elimination operation to determine the Hamming value relationship of said arrays, wherein said one or more bit manipulation cells comprise a plurality of layers of bit manipulation cells, each cell having a plurality of inputs and a plurality of outputs, and said input circuit passes corresponding bits from each of the two binary arrays to respective inputs of bit manipulation cells in the first layer of said processing means, the bit manipulation cells being interconnected by passing the outputs of each layer apart from the last to respective inputs of the next or next-but-one layer, thereby to provide an output indicative of said Hamming relationship.

29. A Hamming value comparator for determining the Hamming value relationship of two one or more dimensional arrays of bits, which comprises an input circuit for applying said arrays to one or more bit manipulation cells or logic elements for performing at least one of a shift operation and a bit elimination operation to determine the Hamming value relationship of said arrays wherein each bit manipulation cell has a first plurality of inputs for receiving respective bits from one of said binary arrays and a second plurality of inputs for receiving respective bits from the other of said binary arrays, and said bit manipulation cell has a corresponding plurality of outputs, and a logic circuit for outputting on a pre-selected one of said outputs a set bit if the Hamming value of the bits set on said first plurality of inputs is greater than the Hamming value of the bits set on said second plurality of inputs.

30. A Hamming value comparator for comparing two one or more dimensional binary arrays which comprises an input circuit for applying said arrays to at least one bit manipulation cell or logic element for performing at least one of a shift operation and a bit elimination operation to determine the Hamming value relationship of said arrays, wherein said at least one bit manipulation cell or logic element compares a plurality of alternate layers of manipulation cells, one of said layers comprising a plurality of first bit manipulation cells for shifting set bits in the input arrays towards a pre-set position, others of said layers comprising a plurality of said first bit manipulation cells, in combination with a Hamming Elimination cell for eliminating corresponding set bits in each of said arrays.

31. A planar Hamming value comparator, for comparing the Hamming values of two 2-dimensional arrays of binary data, which comprises an input circuit for applying said arrays to at least one bit manipulation cell or logic element for performing at least one of a shift operation and a bit elimination operation to determine the Hamming value relationship of said arrays, wherein said at least one bit manipulation cell or logic element comprises a plurality of layers of bit manipulation cells, each cell including at least two inputs and two outputs and being adapted to shift set bits towards a preset bit position, and being interconnected between layers to effect at least one of bit shifting and bit elimination, thereby to obtain an output indicative of the Hamming value relationship of said arrays.

32. A binary sum and threshold device comprising a Hamming value comparator for determining the Hamming value relationship of two one or more dimensional arrays of bits, which comprises an input circuit for applying said arrays to at least one bit manipulation cell or logic element for performing at least one of a shift operation and a bit elimination operation to determine the Hamming value relationship of said arrays.

33. A method of determining the Hamming value relationship of two one or higher dimensional arrays of bits, which comprises applying said arrays to a series of one or more bit manipulation cells each for receiving respective tuples from each of said arrays, and each bit manipulation cell performing an asynchronous Boolean bit shift operation on each of said tuples to shift said bits therein in a predetermined direction and also performing an asynchronous Boolean elimination operation in which set bits in corresponding bit positions in said tuples are unset, thereby to determine the Hamming value relationship of said arrays.

* * * * *